US012787814B2

(12) United States Patent
Brun

(10) Patent No.: US 12,787,814 B2
(45) Date of Patent: Nov. 3, 2026

(54) PACKAGING ARCHITECTURE WITH EDGE RING ANCHORING

(71) Applicant: Intel Corporation, Santa Clara, CA (US)

(72) Inventor: Xavier Francois Brun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 350 days.

(21) Appl. No.: 17/583,485

(22) Filed: Jan. 25, 2022

(65) Prior Publication Data

US 2023/0307341 A1 Sep. 28, 2023

(51) Int. Cl.

| | |
|---|---|
| ***H10W 70/09*** | (2026.01) |
| ***H10W 70/05*** | (2026.01) |
| ***H10W 70/63*** | (2026.01) |
| ***H10W 90/00*** | (2026.01) |
| *H10W 46/00* | (2026.01) |
| *H10W 70/60* | (2026.01) |
| *H10W 74/01* | (2026.01) |

(52) U.S. Cl.

CPC ......... *H10W 70/635* (2026.01); *H10W 70/09* (2026.01); *H10W 70/095* (2026.01); *H10W 90/00* (2026.01); *H10W 46/00* (2026.01); *H10W 46/301* (2026.01); *H10W 70/60* (2026.01); *H10W 74/014* (2026.01); *H10W 74/019* (2026.01)

(58) Field of Classification Search

CPC ... H01L 23/49827; H01L 24/19; H01L 24/20; H01L 25/0652; H01L 25/50

See application file for complete search history.

(56) References Cited

U.S. PATENT DOCUMENTS

2007/0080464 A1* 4/2007 Goebel .................. H01L 24/05 257/784
2012/0305916 A1 12/2012 Liu et al.
2013/0027073 A1 1/2013 Pagani et al.
2016/0056055 A1 2/2016 Ko et al.
2016/0066774 A1* 3/2016 Fujimori .............. H10F 39/806 600/112
2017/0263579 A1 9/2017 Hu (Continued)

OTHER PUBLICATIONS

Zhang, Xiaowu et al "Heterogeneous 2.5D integration on through silicon interposer", Appl. Phys. Rev., vol. 2, No. 2, Jun. 1, 2015, pp. 021308-1 through 021308-58.

*Primary Examiner* — Trang Q Tran

(74) *Attorney, Agent, or Firm* — Akona IP PC

(57) ABSTRACT

A microelectronic assembly is provided, comprising: an interposer having a first face and a second face opposite to the first face; a package substrate coupled to the first face; an integrated circuit die coupled to the second face; and an edge ring in the interposer. The interposer comprises a core comprising a first dielectric material and a redistribution layer (RDL), the RDL being on the first face or the second face, the RDL comprising a second dielectric material different from the first dielectric material, and the edge ring comprises: a metal trace in contact with the second dielectric material, the metal trace being along a periphery of the interposer, and a plurality of metal vias through the RDL, the plurality of metal vias in contact with the metal trace.

20 Claims, 10 Drawing Sheets

(56) References Cited

U.S. PATENT DOCUMENTS

| | | | | |
|---|---|---|---|---|
| 2018/0233462 | A1 | 8/2018 | Gong et al. | |
| 2019/0051621 | A1* | 2/2019 | Liu | H01L 23/49838 |
| 2020/0066625 | A1* | 2/2020 | Chun | H10W 70/65 |
| 2020/0335443 | A1* | 10/2020 | Sun Zhou | H01L 24/95 |
| 2021/0057352 | A1 | 2/2021 | Agarwal et al. | |
| 2021/0098409 | A1* | 4/2021 | Chen | H01L 23/544 |
| 2022/0223557 | A1* | 7/2022 | Chen | H01L 21/56 |
| 2022/0352044 | A1* | 11/2022 | Fan | H01L 23/585 |
| 2023/0065794 | A1* | 3/2023 | Shue | H01L 21/4853 |

* cited by examiner

PACKAGING ARCHITECTURE WITH EDGE RING ANCHORING

TECHNICAL FIELD

The present disclosure relates to techniques, methods, and apparatus directed to a packaging architecture with edge ring anchoring.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
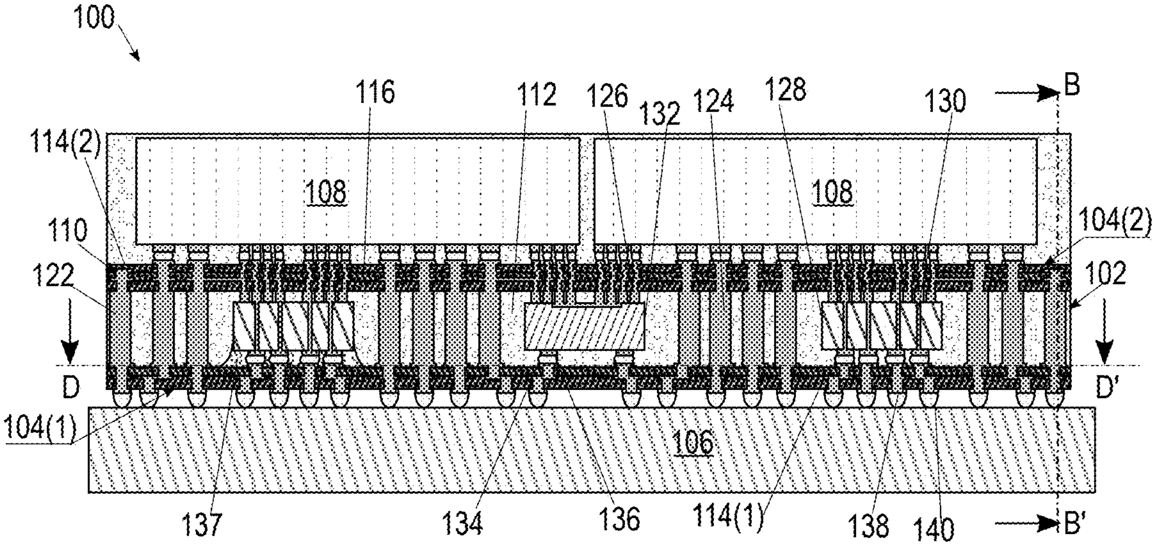
FIG. 1A is a simplified cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

In 2.5D or 3D packaging architecture, with a base die on the bottom and other dies on top, the dies on top communicate laterally with each other using bridge dies (e.g., Intel's embedded multi-die interconnect bridge EMIB™) or by a stacked die arrangement (e.g., Intel's Foveros™) with through-substrate vias (TSVs) in the underlying die, or a stacked package-like arrangement (e.g., Intel's omni-directional interconnects (ODI)). In certain ODI type of packages, the base die is sandwiched within an interposer between a package substrate and the top die. The interposer typically comprises mold compound surrounding the base die. The top die is directly coupled to the base die in some portions and coupled to the package substrate in other portions by through-mold vias (TMVs) in the interposer. Much larger than traditional TSVs, the large TMVs have lower resistance, providing more robust power delivery simultaneously with higher bandwidth and lower latency enabled through stacking. At the same time, this approach reduces the number of TSVs required in the base die, freeing up more area for active transistors and optimizing die size.

However, in such ODI type of packaging architecture today, the edge of the "active" area, comprising a region of operational electric circuitry in the interposer is poorly defined. Further, redistribution layers in the interposer (e.g., on the package side or the top-die side, or both sides) in current ODI packages have a risk of delamination from the underlying (or overlying) mold compound at the edges, especially after dicing operations that initiate microcracks in the structure.

Some embodiments of the present disclosure provide a microelectronic assembly comprising an interposer having a first face and a second face opposite to the first face; a package substrate coupled to the first face; an IC die coupled to the second face; and an edge ring in the interposer. The interposer comprises a core of a first dielectric material and a redistribution layer (RDL), the RDL being on the first face or the second face. The RDL comprises a second dielectric material different from the first dielectric material, and the edge ring comprises a set of stacked metal traces separated by the second dielectric material, each metal trace in the set being along a periphery of the interposer, and a plurality of metal vias through the RDL, the plurality of metal vias in contact with the stacked metal traces in the RDL, the plurality of metal vias and the stacked metal traces forming a mesh structure through a cross-section of the RDL. The edge ring can enable RDL anchoring that prevents propagation of microcracks at sawing sites in the interposer. The edge ring can also define a periphery of the "active region" of the interposer to help resolve process challenges such as singulation (with hairline adjustments) and corresponding metrology for preventing chipping at the mold/blade interface.

In some embodiments, the edge ring may be located at the base of the ODI complex, proximate to the package substrate to help with base complex edge definition for singulation processing and metrology and to provide RDL anchoring. The mesh-like structure with the metal traces and vias helps prevent multi-layer delamination in the RDL, the RDL proximate to the package substrate being anchored by landing vias to the edge metal trace, and the RDL proximate to the top die being anchored to metal pillars (e.g., TMVs) in the core of the interposer. The edge ring provides a physical edge definition for singulation and metrology at no additional cost nor space. Via anchoring of RDLs to either the edge metal trace or metal pillars enables robust organic and/or inorganic RDL process with low delamination risk for both the first layer of the RDL and between each RDL layers because of the mesh-like structure. In addition, non-critical to function bumps between the interposer and the package substrate at the RDL via locations could help package reliability.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as First-Level Interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photoimageable.

The terms “substantially,” “close,” “approximately,” “near,” and “about,” generally refer to being within +/−20% of a target value (e.g., within +/−5% or 10% of a target value) based on the context of a particular value as described herein or as known in the art.

Terms indicating orientation of various elements, e.g., “coplanar,” “perpendicular,” “orthogonal,” “parallel,” or any other angle between the elements, generally refer to being within +/−5%-20% of a target value based on the context of a particular value as described herein or as known in the art.

The term “connected” means a direct connection (which may be one or more of a mechanical, electrical, and/or thermal connection) between the things that are connected, without any intermediary devices, while the term “coupled” means either a direct connection between the things that are connected, or an indirect connection through one or more passive or active intermediary devices.

The description uses the phrases “in an embodiment” or “in embodiments,” which may each refer to one or more of the same or different embodiments.

Furthermore, the terms “comprising,” “including,” “having,” and the like, as used with respect to embodiments of the present disclosure, are synonymous.

The disclosure may use perspective-based descriptions such as “above,” “below,” “top,” “bottom,” and “side”; such descriptions are used to facilitate the discussion and are not intended to restrict the application of disclosed embodiments.

The terms “over,” “under,” “between,” and “on” as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be “on” a second layer refers to a layer that is in direct contact with that second layer. Similarly, unless explicitly stated otherwise, one feature disposed between two features may be in direct contact with the adjacent features or may have one or more intervening layers.

The term “dispose” as used herein refers to position, location, placement, and/or arrangement rather than to any particular method of formation.

The term “between,” when used with reference to measurement ranges, is inclusive of the ends of the measurement ranges.

For the purposes of the present disclosure, the phrase “A and/or B” means (A), (B), or (A and B). For the purposes of the present disclosure, the phrase “A, B, and/or C” means (A), (B), (C), (A and B), (A and C), (B and C), or (A, B, and C). When used herein, the notation “A/B/C” means (A), (B), and/or (C).

Although certain elements may be referred to in the singular herein, such elements may include multiple sub-elements. For example, “an electrically conductive material” may include one or more electrically conductive materials. In another example, “a dielectric material” may include one or more dielectric materials.

Unless otherwise specified, the use of the ordinal adjectives “first,” “second,” and “third,” etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so “ideal” when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
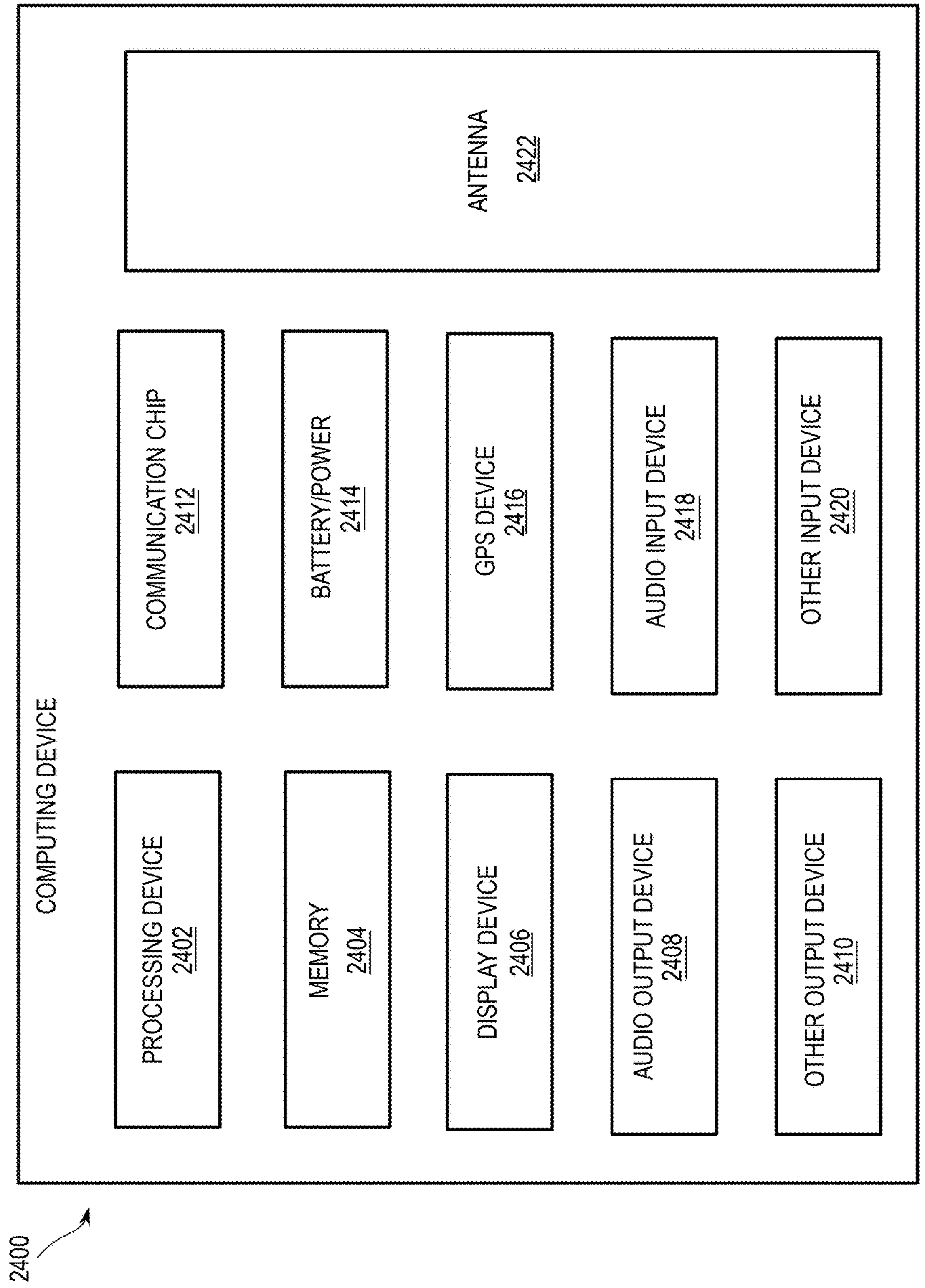
FIG. 10 is a block diagram of an example computing device that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a simplified cross-sectional view of a microelectronic assembly 100 according to some embodiments of the present disclosure. Microelectronic assembly 100 comprises components in several non-coplanar layers as shown. An interposer 102 has faces 104, for example, opposing faces 104(1) and 104(2), with a package substrate 106 coupled to face 104(1) and one or more IC dies 108 (singly, "IC die 108" and collectively "IC dies 108") coupled to opposing face 104(2). Interposer 102 comprises an edge ring 110 in contact with a core 112 comprising a dielectric material and an RDL 114, for example, RDL 114(1) on face 104(1). In some embodiments, interposer 102 may further comprise another RDL 114(2) on face 104(2). RDL 114 may comprise one or more layers of a dielectric material 116, which is different from the dielectric material of core 112. Note that although the RDLs shown in the figure have three layers and are shaded differently merely for illustrative purposes, the number of layers may be more or less in various embodiments, and all layers may comprise the same dielectric material 116. In many embodiments, the dielectric material of core 112 comprises epoxy mold compound, or other organic materials typically used for interposers (e.g., organic materials with low coefficient of thermal expansion (CTE), high elastic modulus and high reliability). Dielectric material 116, on the other hand, comprises polyimide or other such organic materials that are suitable for thin-film processing in some embodiments.

In some other embodiments, dielectric material 116 may comprise inorganic materials, such as a compound of silicon and one of oxygen, nitrogen and carbon (e.g., silicon nitride, silicon oxide, silicon carbide, silicon carbonitride, silicon oxynitride, etc.). In some embodiments, for example, where RDL 114 comprises more than one layer, some layers may comprise organic materials, and other layers may comprise inorganic materials. In embodiments where dielectric material 116 comprises organic and inorganic materials, the layers closer to IC dies 108 may comprise inorganic materials, and other layers closer to core 112 may comprise organic materials. In some embodiments, RDL 114(1) proximate to package substrate 106 may comprise organic materials and RDL 114(2) proximate to IC dies 108 may comprise inorganic materials.

Figures 1B, 1C:
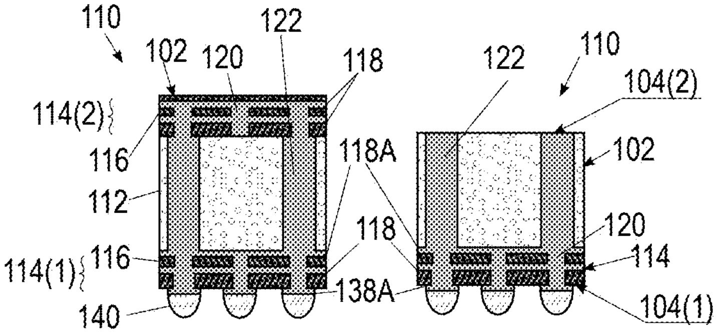
FIG. 1B is a simplified cross-sectional view of a portion of the microelectronic assembly of FIG. 1A, according to one embodiment.
FIG. 1C is a simplified cross-sectional view of a portion of the microelectronic assembly of FIG. 1A, according to another embodiment.
Figure 1D:
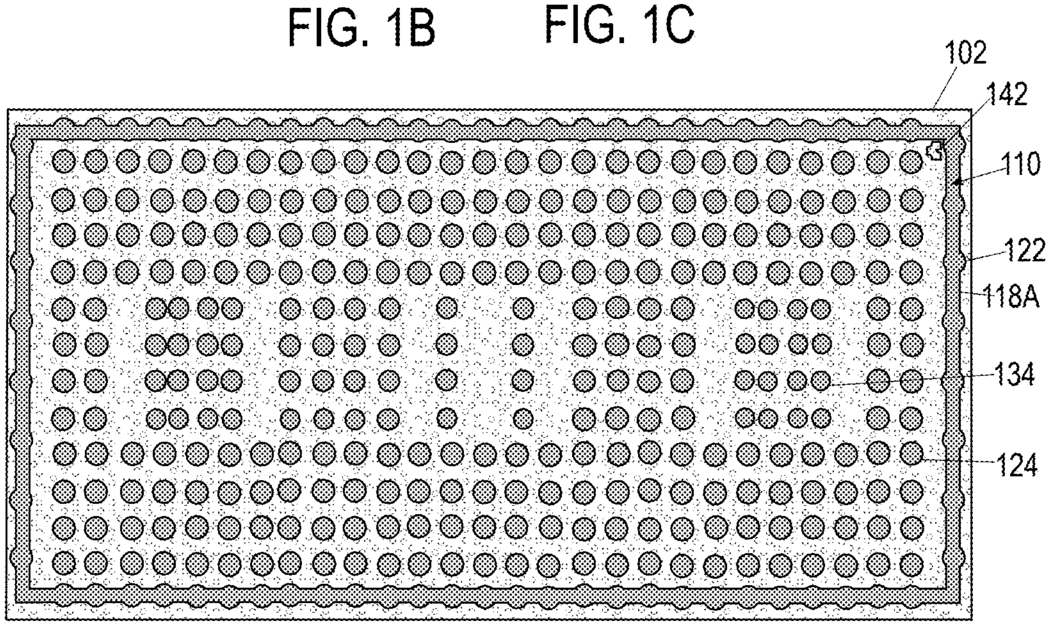
FIG. 1D is a simplified top view of a portion of the microelectronic assembly of FIG. 1A, according to some embodiments of the present disclosure.

FIGS. 1B and 1C show two different embodiments of a portion of edge ring 110 across axis BB' in greater detail. FIGS. 1B and 1C are similar except that the embodiment shown in FIG. 1C has only one RDL 114, which is on face 104(1) of interposer 102, whereas the embodiment shown in FIG. 1B has two RDLs, 114(1) on face 104(1) and 114(2) on face 104(2) of interposer 102. In various embodiments, edge ring 110 may comprise a set of stacked metal traces 118 in contact with dielectric material 116, for example, separated by dielectric material 116 of RDL 114, each metal trace 118 being along a periphery of interposer 102, for example, parallel to and proximate to the edge (e.g., boundary) of interposer 102. In some embodiments, at least one metal trace 118A in the stacked metal traces 118 may be at an interface between core 112 and RDL 114, for example, proximate to face 104(1) (as shown) or to face 104(2) (not shown). In some other embodiments, the at least one metal trace 118A may be embedded inside dielectric material 116 (e.g., in RDL 114(1), or RDL 114(2), or both), and may not contact core 112. Each metal trace 118 may be in the shape of a rectangular ring (e.g., as shown in FIG. 1D), the ring being parallel to faces 104 and to each other. In some embodiments, only the at least one metal trace 118A may be present in the set of metal traces.

Edge ring 110 may further comprise a plurality of metal vias 120 through dielectric material 116 of RDL 114. Metal vias 120 are in contact with stacked metal traces 118 such that metal vias 120 and stacked metal traces 118 form a mesh structure through a cross-section of RDL 114 (e.g., metal traces 118 form horizontal lines and metal vias 120 form vertical lines of the mesh structure in FIGS. 1B and 1C). Note that the mesh structure extends through RDL 114 all around the periphery of interposer 102. In embodiments where RDL 114 is disposed on two faces 104(1) and 104(2) as shown in FIG. 1B, each RDL 114(1) and 114(2) may comprise separate sets of stacked metal traces 118 and plurality of metal vias 120, thereby creating separate mesh structures in RDL 114(1) and 114(2).

In embodiments where RDL 114 comprises more than one layer of dielectric material 116, metal traces 118 may be disposed between layers, with dielectric material 116 of each layer separating any two metal traces 118. Metal traces 118 in any one layer may be parallel and aligned with metal traces in any other layer, forming a stacked set of similar (or identical) metal traces across the layers. Metal traces 118 across different layers may have the same width and thickness in some embodiments. In other embodiments, metal traces 118 may have differing widths and thickness in different layers. Metal vias 120 may pass through each layer and contact metal traces 118 on either side of the layer. In embodiments where only the at least one metal trace 118A is present in the set, metal vias 120 may pass through, or otherwise contact metal trace 118A. The mesh structure created by metal vias 120 and metal traces 118 serves to prevent delamination of the different layers in RDL 114, and also to anchor RDL 114 to core 112 in addition to any other electrical or thermal advantages.

In embodiments where dielectric material 116 of RDL 114 comprises organic materials and inorganic materials, for example, in different layers, layers that comprise inorganic materials may permit finer pitch of metal traces 118 and vias 120 than layers comprising organic materials. In an example embodiment, line spacing and line widths of metal traces 118 may be 2 microns in layers of RDL 114 comprising inorganic material, whereas line spacing and line widths of metal traces 118 may be greater than 10 microns in layers of RDL 114 comprising organic material.

In the example embodiments shown, a plurality of metal pillars 122 through core 112 serves to anchor RDL 114 to core 112 more firmly. In some embodiments, metal pillars 122 contact metal trace 118A; in other embodiments, metal pillars 122 contact metal vias 120; in yet other embodiments, metal pillars 122 contact both metal trace 118A and metal vias 120. For example, in the embodiment shown in FIG. 1B, where metal trace 118A is at the interface between core 112 and RDL 114(1), metal pillars 122 are coupled to metal trace 118A in RDL 114(1) and to metal vias 120 in RDL 114(2). In the embodiment shown in FIG. 1C, metal pillars 122 are coupled to metal trace 118A, but not to metal vias 120, as RDL 114(2) is not present.

In various embodiments the pitch between adjacent ones of metal vias 120 may be smaller than the pitch between adjacent ones of metal pillars 122. Thus, some of metal vias 120 may not contact metal pillars 122, whereas other ones of metal vias 120 may contact metal pillars 122 (e.g., as shown in the figures). In some embodiments, all metal pillars 122 may have more or less the same diameter. Metal pillars 122 may have a larger diameter than metal vias 120. In some embodiments, metal pillars 122 may have a diameter larger than a width of metal traces 118; in other embodiments, metal pillars 122 may have a diameter smaller than the width of metal traces 118. In various embodiments, metal traces 118, metal vias 120 and metal pillars 122 may comprise copper. In other embodiments, metal traces 118, metal vias 120 and metal pillars 122 may comprise any other metal of sufficient mechanical strength to anchor RDL 114 to core 112 and prevent delamination of individual layers of RDL 114.

Turning back to FIG. 1A, interposer 102 further comprises TMVs 124 through core 112. IC dies 108 are coupled to interposer 102 by interconnects 126. In various embodiments, interconnects 126 may comprise one or more types of DTD interconnects as described previously. In some embodiments, interposer 102 may comprise other IC dies, for example, IC die 128 that has TSVs 130 therein for electrical connectivity through the thickness from one side of IC die 128 to the other side. In some embodiments, interposer 102 may comprise in addition or alternatively, IC die 132 without any TSV 130. IC dies 128 and 132 may have bond pads 134, which may be used to couple to interposer 102 by interconnects 136. In various embodiments, interconnects 136 may comprise one or more types of DTD interconnects as described previously. In some embodiments (not shown), IC dies 128 and/or 132 may be located in a cavity within core 112. In other embodiments (as shown), IC dies 128 and/or 132 may extend through the thickness of core 112. In some embodiments, underfill 137 may be dispensed underneath one or more of IC dies 128 and/or 132 around interconnects 136, for example, for enhanced thermo-mechanical reliability. In various embodiments, bond pads 138 on face 104(1) of interposer 102 may be used to bond to package substrate 106 by interconnects 140. In various embodiments, interconnects 140 may comprise one or more types of DTPS interconnects as described previously.

In various embodiments, metal vias 120 of edge ring 110 may be coupled to some bond pads 138A, as shown in greater detail in FIGS. 1B and 1C. In various embodiments, such bond pads 138A may be aligned with (e.g., directly above or below) metal traces 118. Interconnects 140 coupled to such bond pads 138A may be non-critical to function; in other words, such interconnects 140 may be electrically isolated and/or otherwise non-functioning during operation of microelectronic assembly 100. In various embodiments, the entirety of edge ring 110, including metal traces 118 and metal vias 120 may also be electrically isolated from other components in microelectronic assembly 100 and/or otherwise non-functioning during operation of microelectronic assembly 100.

FIG. 1D is a top view of the example microelectronic assembly 100 of FIG. 1A, taken across axis DD' in a plane of metal trace 118A, at the interface between core 112 and RDL 114(1). As shown in the figure, metal trace 118A runs along a periphery of interposer 102 and may be in the shape of a rectangular ring that follows a boundary or periphery of microelectronic assembly 100. Other metal traces 118 (not shown) are parallel to metal trace 118A in both RDL 114(1) and 114(2) as applicable. Areas of coupling to metal pillars 122 are visible as undulations in the edges of metal trace 118A. The undulations come about because the diameter of metal pillars 122 is larger than the width of metal trace 118A (and other metal traces 118) in the particular embodiment shown. In embodiments where the diameter of metal pillars 122 is smaller than the width of metal trace 118A (and other metal traces 118), no such undulations may be present. Also shown in the figure are TMVs 124 and bond pads 134. In some embodiments, TMVs 124 may have a larger diameter than bond pads 134; in other embodiments, they may be similarly sized.

In some embodiments, metal trace 118A may further comprise a fiducial mark 142. Fiducial mark 142 may be of any suitable shape and/or size. In general, fiducial mark 142 is placed in the field of view of an imaging system for use as a point of reference, as a measure, or for stabilizing the field of view. Fiducial mark 142 may also function as a reference point to which other objects can be related or against which objects can be measured. For example, fiducial mark 142 may be used to position a dicing equipment accurately to enable accurate cutting of microelectronic assembly 100 during manufacture, or for aligning multiple RDL layers accurately, or in other processing and metrology applications. In some embodiments, fiducial mark 142 may be replicated through all metal traces 118 in RDL 114; in other embodiments, fiducial mark 142 may be present, but as a different shape or in a different location, in each layer of metal traces 118; in yet other embodiments, fiducial mark 142 may be present only for metal trace 118A. In some embodiments, three such fiducial mark 142 may be present in any layer of metal traces 118, serving to determine any rotation during processing. Any number of fiducial mark 142 may be present in microelectronic assembly 100 within the broad scope of the embodiments.

Figure 2A:
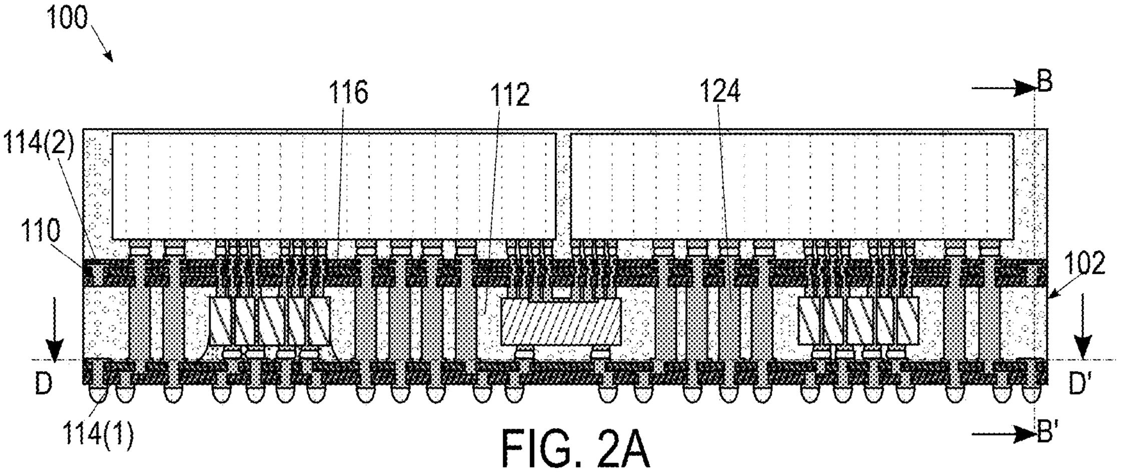
FIG. 2A is a simplified cross-sectional view of another example microelectronic assembly according to some embodiments of the present disclosure.
Figures 2B, 2C:
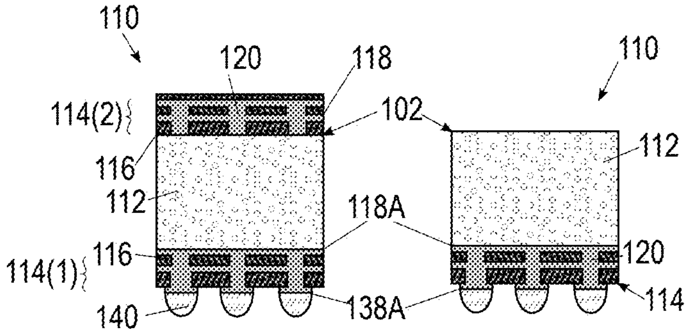
FIG. 2B is a simplified cross-sectional view of a portion of the microelectronic assembly of FIG. 2A, according to one embodiment.
FIG. 2C is a simplified cross-sectional view of a portion of the microelectronic assembly of FIG. 2A, according to another embodiment.
Figure 2D:
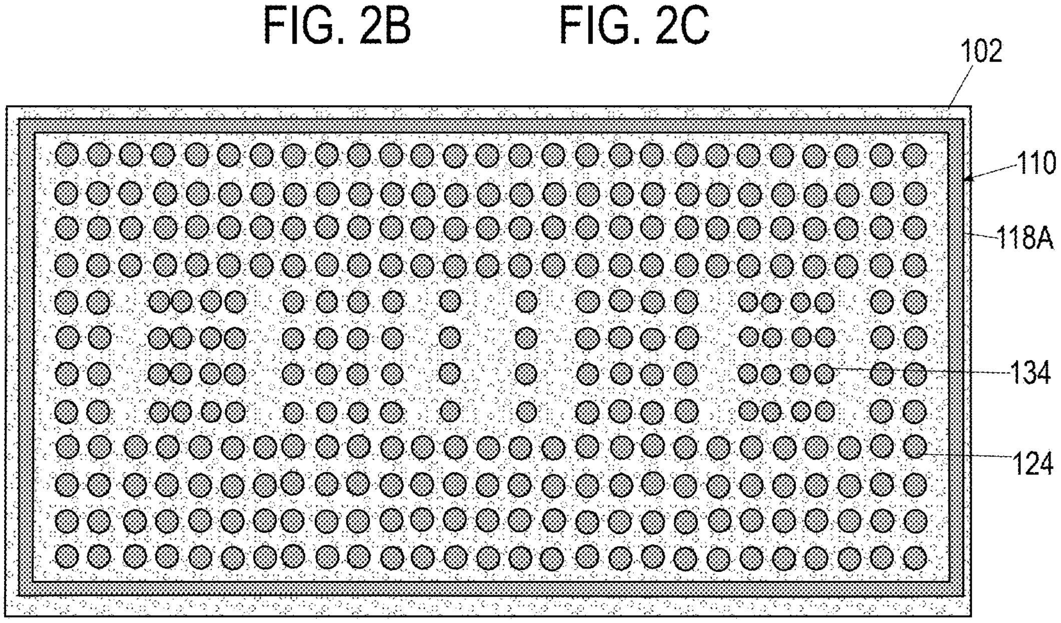
FIG. 2D is a simplified top view of a portion of the microelectronic assembly of FIG. 2A, according to some embodiments of the present disclosure.

FIG. 2A is a simplified cross-sectional view of an embodiment of microelectronic assembly 100. The embodiment shown in FIG. 2A is substantially similar to that in FIG. 1A, except that metal pillars 122 are lacking in edge ring 110. As shown in greater detail in FIGS. 2B and 2C, which show portions of edge ring 110 across axis BB' in microelectronic assembly 100 of FIG. 2A, metal trace 118A at the interface between core 112 and RDL 114 proximate to face 104(1) is coupled by metal vias 120 to bond pads 138A of interconnects 140. Dielectric material 116 separates metal trace 118A from others in the set of stacked metal traces 118 in RDL 114. Whereas the embodiment shown in FIG. 2D has a second RDL 114(2) on face 104(2), the meshes formed by metal traces 118 and metal vias 120 in each RDL 114(1) and 114(2) are not coupled to each other. However, metal vias 120 in each layer of RDL 114 serves to anchor the layer to the material underlying the layer; for example, metal vias 120 may anchor RDL 114(2) to core 112; metal vias 120 may separately anchor RDL 114(1) to metal trace 118A. As shown in FIG. 2D, which is a top view of microelectronic assembly 100 across axis DD' in FIG. 2A, metal trace 118A of edge ring 110 does not have any undulations because metal pillars 122 are absent. In such embodiments (and in embodiments where metal pillars 122 have a smaller diameter than the width of metal traces 118), metal trace 118A forms a straight edged rectangular ring along the periphery of interposer 102.

Figure 3:
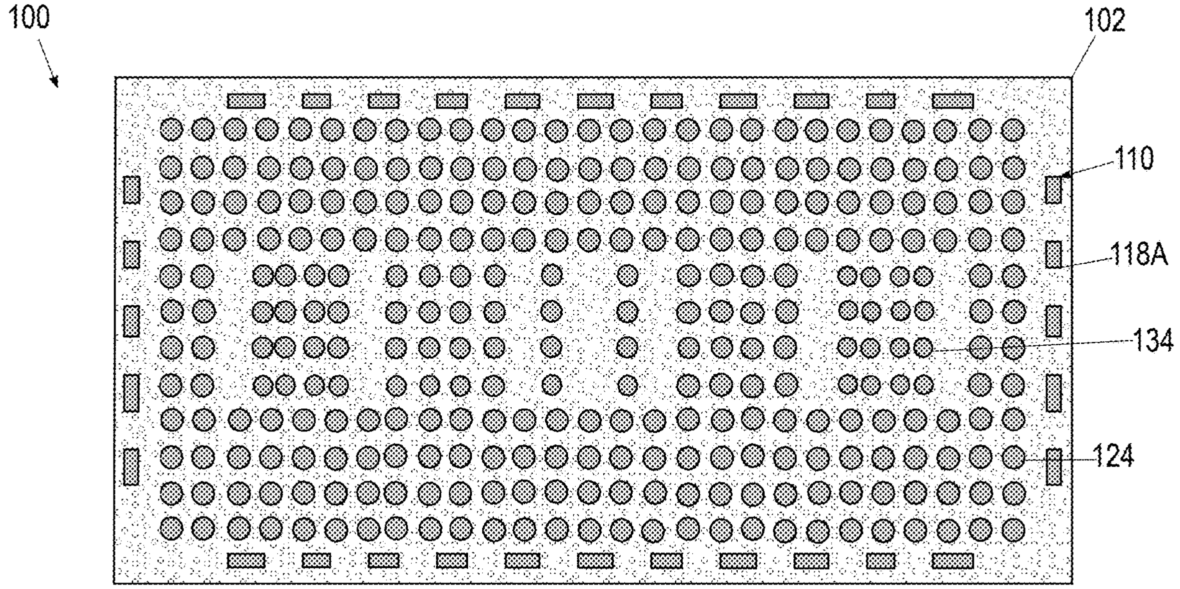
FIG. 3 is a simplified top view of a portion of yet another example microelectronic assembly according to some embodiments of the present disclosure.

FIG. 3 is a simplified top view of an embodiment of microelectronic assembly 100, taken along a plane parallel to face 104(1) at an interface between core 112 and RDL 114(1) proximate to face 104(1). The embodiment shown in FIG. 3 is substantially similar to that in FIGS. 1A and/or 2A, except that metal trace 118A forms a discontinuous ring along the periphery of interposer 102. In some embodiments, other metal traces 118 of edge ring 110 may be parallel to metal trace 118A with gaps aligned with respect to each other. In other embodiments, other metal traces 118 of edge ring 110 may be parallel to metal trace 118A with gaps misaligned with respect to each other. In yet other embodiments, some of metal traces 118 may form continuous rings, and some others of metal traces 118 may form discontinuous rings with gaps aligned (or misaligned) with metal trace 118A. In some embodiments, each discontinuous piece of metal trace 118A may be in contact with at least one of metal pillars 122; in some embodiments, two ends of each discontinuous piece of metal trace 118A may be coupled to a separate one of metal pillars 122.

Figure 4:
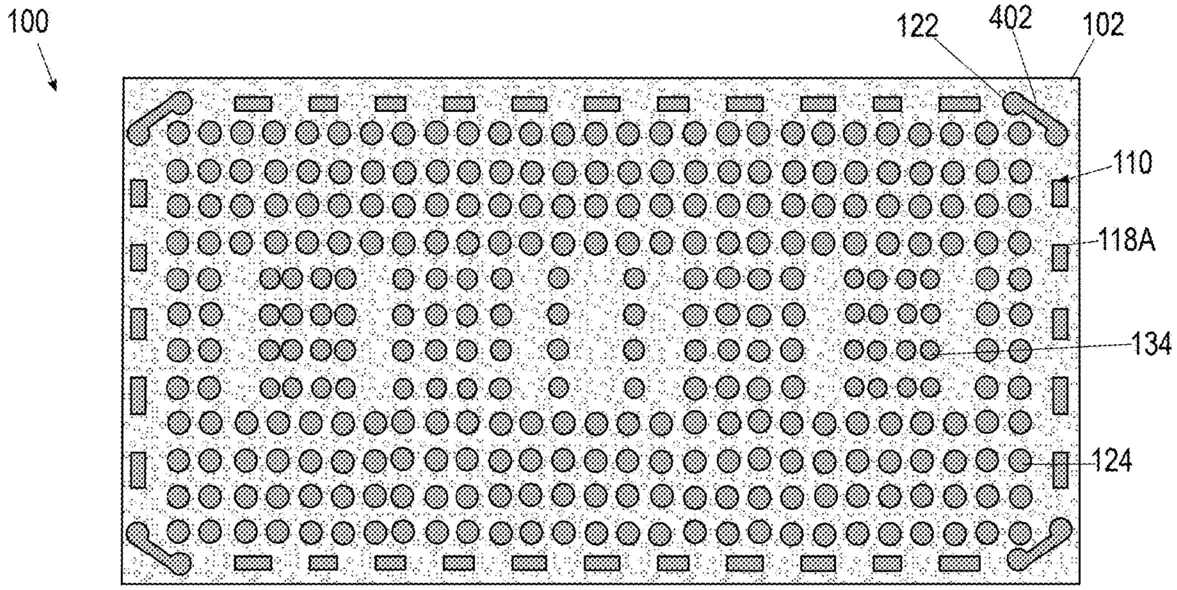
FIG. 4 is a simplified top view of a portion of yet another example microelectronic assembly, according to some embodiments of the present disclosure.

FIG. 4 is a simplified top view of an embodiment of microelectronic assembly 100, taken along a plane parallel to face 104(1) at an interface between core 112 and RDL 114(1) proximate to face 104(1). The embodiment shown in FIG. 4 is substantially similar to that shown in FIG. 3, except that a chamfer 402 is present at the corners of the ring. In some embodiments, chamfer 402 may form a 45-degree angle between the two orthogonal sides of the ring. In some embodiments, each end of the piece forming chamfer 402 may be coupled to a separate one of metal pillars 122 to provide additional anchoring.

Figure 5A:
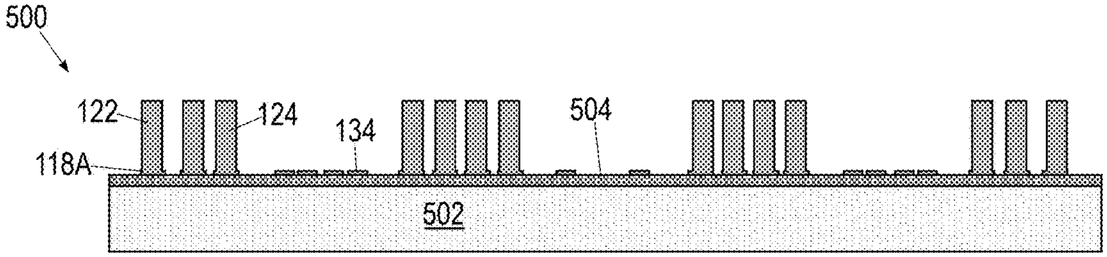
FIGS. 5A-5E are simplified cross-sectional views of various stages of manufacture of an example microelectronic assembly, according to some embodiments of the present disclosure.

FIGS. 5A-5E are simplified cross-sectional views of various stages of manufacture of microelectronic assembly 100 according to an embodiment of the present disclosure, in which top IC dies 108 are assembled last (top-die last process). FIG. 5A shows an assembly 500 in which a carrier 502 is overlaid with an adhesive 504. In some embodiments, carrier 502 may comprise a wafer of inorganic material such as glass or silicon. In other embodiments, carrier 502 may comprise a panel of inorganic material, such as glass or ceramic. Any suitable wafer or panel of appropriate size may be used within the broad scope of the embodiments. Metal corresponding to metal trace 118A, metal pillars 122, TMVs 124 and bond pads 134 may be deposited over adhesive 504 on carrier 502. In some embodiments, metal corresponding to metal trace 118A and bond pads 134 and a portion of metal pillars 122 and TMVs 124 may be deposited first, followed by further addition of metal corresponding to metal pillars 122 and TMVs 124. In some embodiments, a blanket layer of metal may be deposited first, followed by etching to remove excess material and form metal trace 118A, metal pillars 122, TMVs 124 and bond pads 134 appropriately.

Figure 5B:
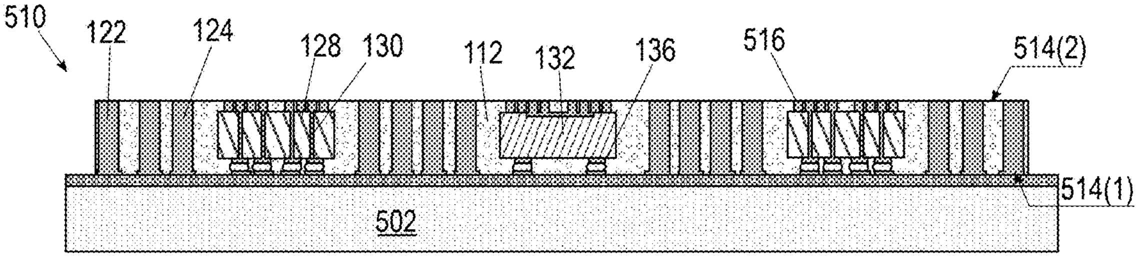

FIG. 5B is a simplified cross-sectional view of assembly 510 subsequent to forming a portion of interposer 102 over carrier 502. A surface 514(1) of the portion of interposer 102 is in contact with adhesive 504. Surface 514(2) of the portion of interposer 102 is opposite to carrier 502. In various embodiments, IC dies 128 and 132 may be attached to appropriate bond pads 134 by interconnects 136, followed by depositing of dielectric material of core 112. Underfill 137 may be dispensed underneath IC dies 128 and/or 132 around interconnects 136 and cured before depositing the dielectric material of core 112. In some embodiments, surface 514(2) may be formed by planarization (e.g., by chemical mechanical polishing (CMP)) to expose bondable surfaces of IC dies 128 and 132. In some other embodiments, conductive vias 516 may be formed through the dielectric material of core 112 to enable electrical coupling of IC dies 128 and 132 to surface 514(2).

Figure 5C:
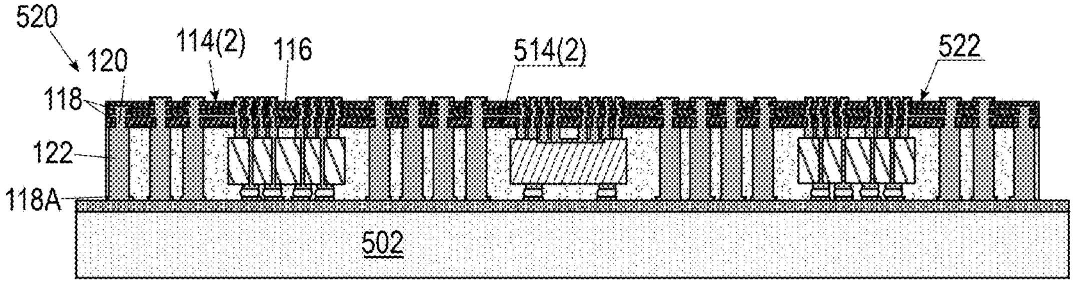

FIG. 5C is a simplified cross-sectional view of assembly 520 subsequent to forming RDL 114 over surface 514(2). In embodiments in which there are two RDLs on either side of interposer 102, assembly 520 may include RDL 114(2). In some embodiments where no RDL is present on the die side of interposer 102 (i.e., face 104(2), as opposed to the package side), this process may be skipped entirely. The process of forming RDL 114(2) is as follows: Material corresponding to metal vias 120 may be deposited on surface 514(2), followed by deposition of dielectric material 116. Subsequently, material corresponding to metal traces 118 and other conductive traces is formed on deposited dielectric material 116. Subsequently, dielectric material 116 may be deposited thereon. The process of forming metal vias 120, depositing dielectric material 116, forming metal traces 118, and depositing dielectric material 116 thereon may be repeated until the desired number of layers is formed in RDL 114(2). At the end of the process, surface 522 of RDL 114(2) may be exposed for further processing. In various embodiments, a final metallization layer comprising conductive traces and bond pads for attaching IC dies 108 may be exposed on surface 522. In some embodiments, metal traces 118 and metal vias 120 corresponding to edge ring 110 may remain unexposed within RDL 114(2) (as shown).

Figure 5D:
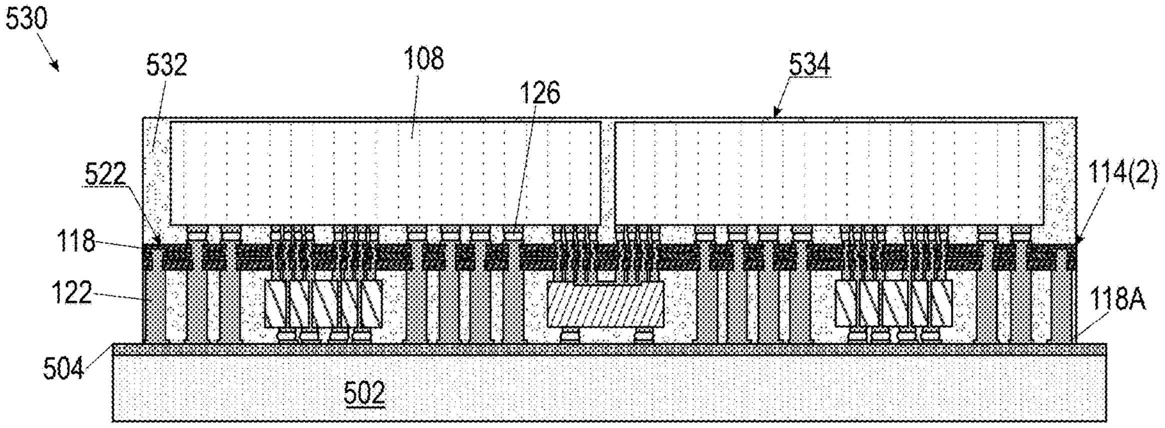

FIG. 5D is a simplified cross-sectional view of assembly 530 subsequent to attaching IC dies 108 to surface 522 with interconnects 126. In some embodiments (as shown), mold compound 532 may be deposited to encapsulate IC dies 108 appropriately and expose surface 534 for further processing. In some embodiments, mold compound 532 is absent, and surface 534 may simply comprise the top surfaces of IC dies 108 that are opposite to carrier 502. In other embodiments in which IC dies 108 are embedded within mold compound 532 (as shown), surface 534 comprises the surface of mold compound 532. In yet other embodiments, surface 534 may comprise exposed surfaces of IC dies 108 that are coplanar with exposed surfaces of mold compound 532. In some embodiments, surface 534 may be planarized by grinding and/or CMP processes.

Figure 5E:
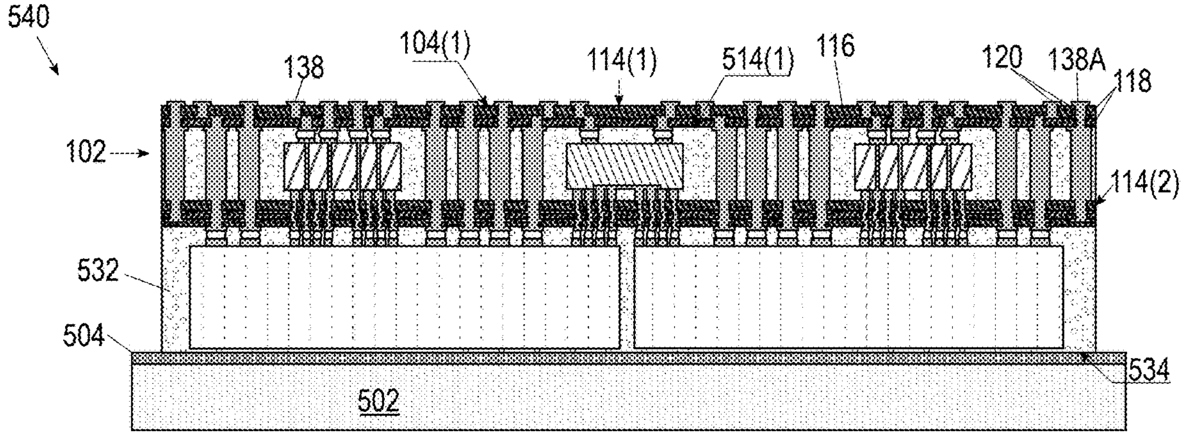

FIG. 5E is a simplified cross-sectional view of assembly 540 subsequent to forming RDL 114(1) on surface 514(1). Carrier 502 is removed from surface 514(1), then assembly 530 is turned over, and carrier 502 is removably attached by adhesive 504 to surface 534. Subsequently, RDL 114(1) is formed over surface 514(1) in a manner similar to forming RDL 114(2), as described with reference to FIG. 5C. At the end of the process, bond pads 138, including bond pads 138A, are formed on face 104(1) for attaching to package substrate 106 with interconnects 140 (not shown). In some embodiments, non-functional bond pads 138A may be coupled to metal vias 120 in RDL 114(1); in other embodiments, metal traces 118 and metal vias 120 of edge ring 110 may not be exposed at face 104(1) (in such embodiments, bonds pads 138A may be absent). Subsequently, assembly

540 may be diced into individual microelectronic assemblies 100 and coupled to separate package substrates 106 appropriately. Edge ring 110 may prevent microcracks formed during the dicing process from propagating into the rest of the structure during operation, facilitating increased reliability for microelectronic assembly 100.

Figure 6A:
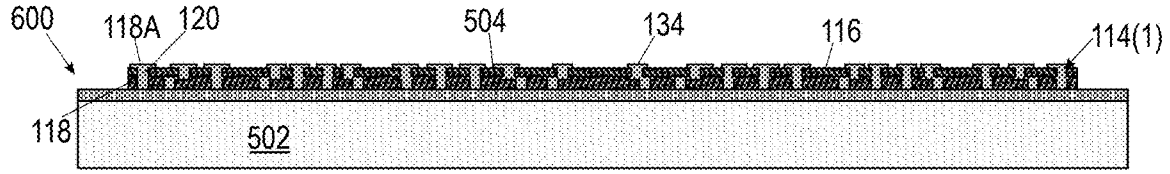
FIGS. 6A-6E are simplified cross-sectional views of various stages of manufacture of an example microelectronic assembly, according to another embodiment of the present disclosure.

FIGS. 6A-6D are simplified cross-sectional views of various stages of manufacture of microelectronic assembly 100 according to another embodiment of the present disclosure, in which RDL 114(1) is formed first and microelectronic assembly 100 built up sequentially thereafter. FIG. 6A shows assembly 600 after forming RDL 114(1) over carrier 502. In various embodiments, adhesive 504 may be provisioned between carrier 502 and RDL 114(1), for example, for ease of removal later in the operations. Metal traces 118, including metal trace 118A may be formed in RDL 114(1), along with metal vias 120, bond pads 134, etc. as appropriate.

Figure 6B:
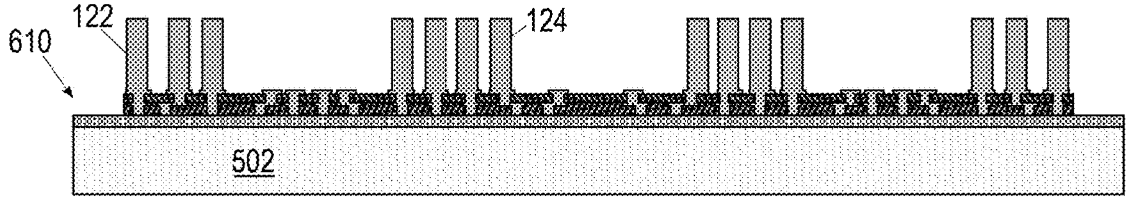

FIG. 6B shows an assembly 610 subsequent to forming metal pillars 122 and those corresponding to TMVs 124 over RDL 114(1). In some embodiments, metal pillars 122 and those corresponding to TMVs 124 may be formed by selective deposition over appropriate pads and/or traces. In some embodiments, a blanket layer of metal may be deposited first, followed by etching to remove excess material and form metal pillars 122 and TMVs 124 appropriately.

Figure 6C:
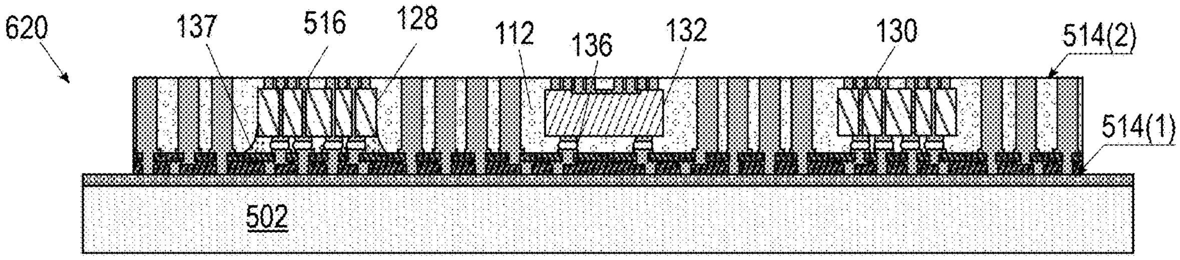

FIG. 6C is a simplified cross-sectional view of assembly 620 subsequent to forming core 112 over RDL 114(1). A surface 514(1) of interposer 102 is in contact with adhesive 504. Surface 514(2) of the portion of interposer 102 is opposite to carrier 502. In various embodiments, IC dies 128 and 132 may be attached to appropriate bond pads 134 by interconnects 136, followed by deposition and curing of underfill 137 (if used), followed by depositing of dielectric material of core 112. In some embodiments, surface 514(2) may be formed by planarization (e.g., by CMP) to expose bondable surfaces of IC dies 128 and 132. In some other embodiments, conductive vias 516 may be formed through the dielectric material of core 112 to enable electrical coupling of IC dies 128 and 132 to surface 514(2).

Figure 6D:
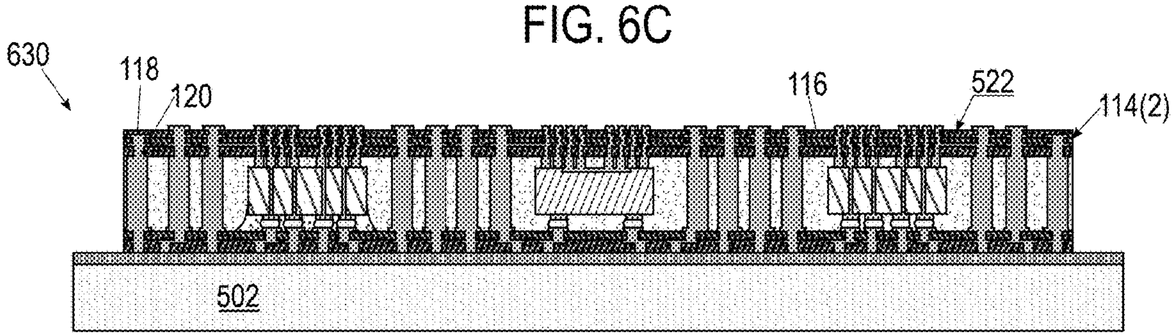

FIG. 6D is a simplified cross-sectional view of assembly 630 subsequent to forming RDL 114(2) over surface 514(2). The process of forming RDL 114(2) is as described with reference to FIG. 5C. At the end of the process, surface 522 of RDL 114(2) may be exposed for further processing. In various embodiments, a final metallization layer comprising conductive traces and bond pads for attaching IC dies 108 may be exposed on surface 522. In some embodiments, metal traces 118 and metal vias 120 corresponding to edge ring 110 may remain unexposed within RDL 114(2) (as shown).

Figure 6E:
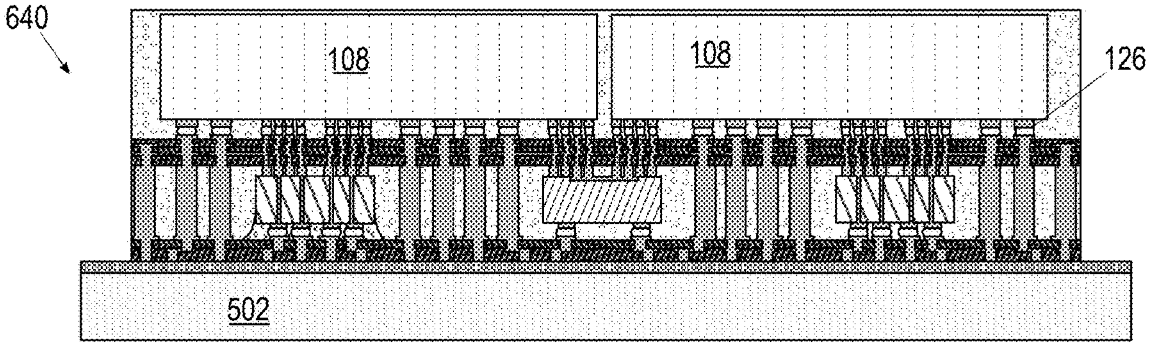

FIG. 6E is a simplified cross-sectional view of assembly 640 subsequent to attaching IC dies 108 to surface 522 with interconnects 126. In some embodiments (as shown), mold compound 532 may be deposited to encapsulate IC dies 108 appropriately and expose surface 534 for further processing. In some embodiments, mold compound 532 is absent, and surface 534 may simply comprise the top surfaces of IC dies 108 that are opposite to carrier 502. In other embodiments in which IC dies 108 are embedded within mold compound 532 (as shown), surface 534 comprises the surface of mold compound 532. In yet other embodiments, surface 534 may comprise exposed surfaces of IC dies 108 that are coplanar with exposed surfaces of mold compound 532. In some embodiments, surface 534 may be planarized by grinding and/or CMP processes.

Subsequently, assembly 640 may be diced into individual microelectronic assemblies 100 and coupled to separate package substrates 106 appropriately. Edge ring 110 may prevent microcracks formed during the dicing process from propagating into the rest of the structure during operation, facilitating increased reliability for microelectronic assembly 100.

Figure 7A:
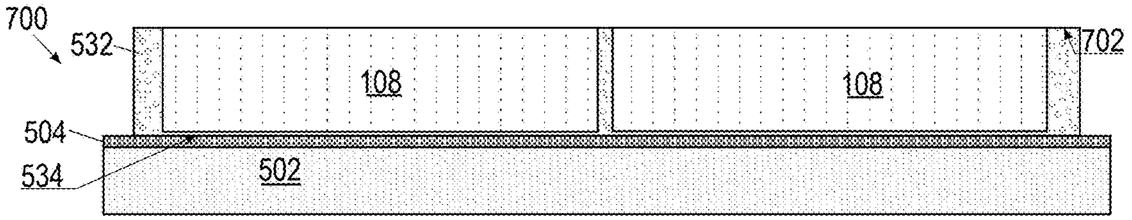
FIGS. 7A-7D are simplified cross-sectional views of various stages of manufacture of an example microelectronic assembly, according to yet another embodiment of the present disclosure.

FIGS. 7A-7D are simplified cross-sectional views of various stages of manufacture of microelectronic assembly 100 according to another embodiment of the present disclosure, in which top IC dies 108 are assembled first (top-die first process). FIG. 7A shows an assembly 700 in which carrier 502 is overlaid with adhesive 504 and attached to surface 534 of the layer comprising IC dies 108. In some embodiments in which mold compound 532 is absent, IC dies 108 may be directly attached by adhesive 504 to carrier 502; in other embodiments in which IC dies 108 are embedded within mold compound 532, surface 534 of mold compound 532 may be attached by adhesive 504 to carrier 502; in yet other embodiments, surface 534 attached by adhesive 504 to carrier 502 may comprise exposed surfaces of IC dies 108 that are coplanar with exposed surfaces of mold compound 532. A surface 702 opposite to carrier 502 may be exposed for further processing.

Figure 7B:
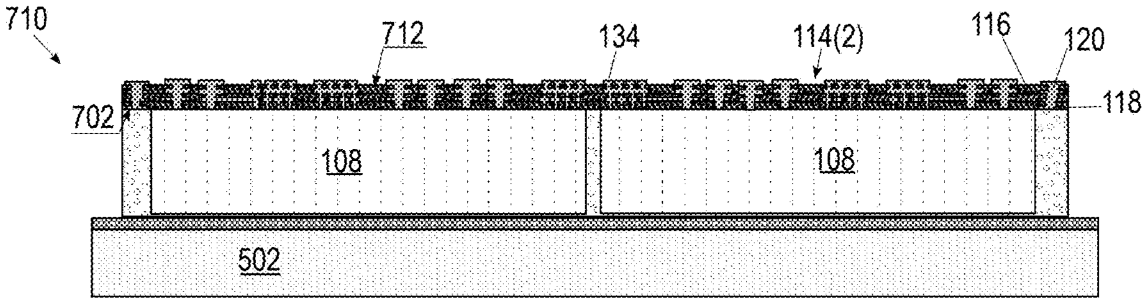

FIG. 7B is a simplified cross-sectional view of assembly 710 subsequent to forming RDL 114 over surface 602. In embodiments in which there are two RDLs on either side of interposer 102, assembly 710 includes RDL 114(2). In some embodiments where no RDL is present on the die side of interposer 102 (i.e., face 104(2), as opposed to the package side), this process may be skipped entirely. The process of forming RDL 114(2) is as described with reference to FIG. 5C. At the end of the process, surface 714 opposite to carrier 502 may be exposed for further processing. Bond pads 134 and other conductive traces and/or pads corresponding to TMVs 124 and metal pillars 122 may also be present on exposed surface 714.

Figure 7C:
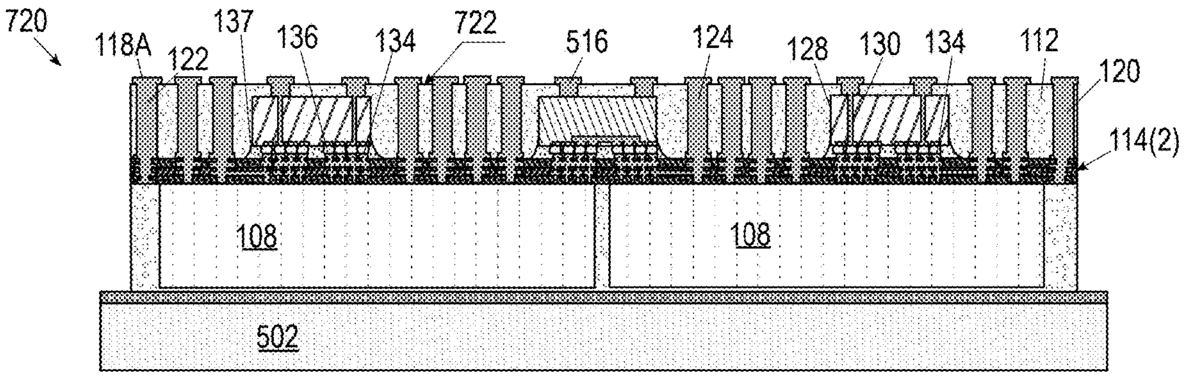

FIG. 7C is a simplified cross-sectional view of assembly 720 subsequent to forming a portion of interposer 102 over surface 614. IC dies 128 and/or 132 may be attached to bond pads 134 by interconnects 136. Underfill 137 may be dispensed underneath IC dies 128 and/or 132 around interconnects 136 and cured. In the figure, underfill 137 is shown dispensed underneath all of IC dies 128 and 132. In other embodiments, underfill 137 may be dispensed only under some (or none) of IC dies 128 and/or 132. Thereafter, pillars corresponding to metal pillars 122 and TMVs 124 may be formed, for example, by electrodeposition processes. Then, the dielectric material of core 112 may be deposited around IC dies 128 and/or 132 and pillars corresponding to metal pillars 122 and TMVs 124. At the end of the process, surface 722 may be exposed for further processing. In some embodiments, surface 722 may be formed by planarization (e.g., by CMP) to expose bondable surfaces of IC dies 128 and 132. In some other embodiments, conductive vias 516 may be formed through the dielectric material of core 112 to enable electrical coupling of IC dies 128 and 132 to surface 722. Metal trace 118A and other conductive traces may be deposited over surface 722 in some embodiments.

Figure 7D:
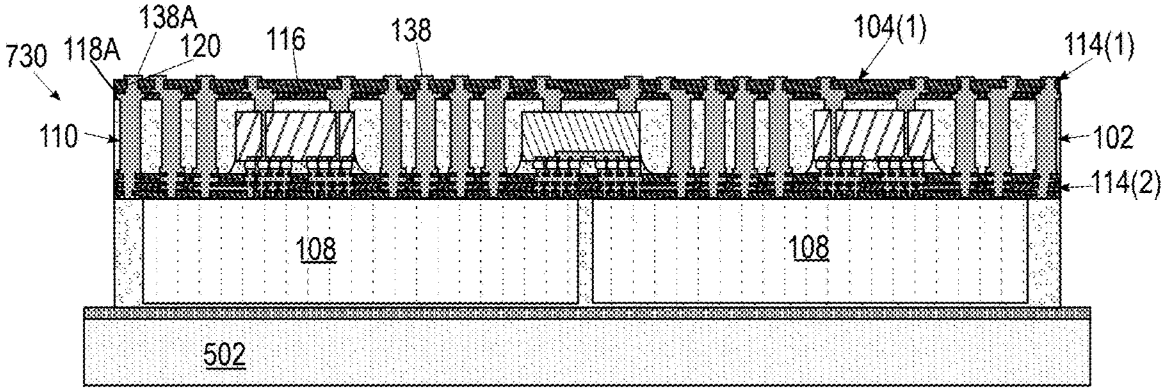

FIG. 7D is a simplified cross-sectional view of assembly 730 subsequent to forming RDL 114(1) over surface 722. RDL 114(1) is formed in a manner similar to forming RDL 114(2), as described with reference to FIG. 5C. Note that at the end of this process, unlike in the processes described with reference to previous FIGS. 5 and 6, metal trace 118A may be embedded in dielectric material 116 rather than in core 112. Bond pads 138, including bond pads 138A, are exposed on face 104(1) for attaching to package substrate 106 with interconnects 140 (not shown). In some embodiments, non-functional bond pads 138A may be coupled to metal vias 120 in RDL 114(1); in other embodiments, metal traces 118 and metal vias 120 of edge ring 110 may not be exposed at face 104(1) (in such embodiments, bonds pads 138A may be absent). Subsequently, assembly 730 may be diced into individual microelectronic assemblies 100 and coupled to separate package substrates 106 appropriately. Edge ring 110 may prevent microcracks formed during the dicing process from propagating into the rest of the structure during operation, facilitating increased reliability for microelectronic assembly 100.

In various embodiments, any of the features discussed with reference to any of FIGS. 1-7 herein may be combined with any other features to form a package with one or more IC dies as described herein, for example, to form a modified microelectronic assembly 100. Some such combinations are described above, but, in various embodiments, further combinations and modifications are possible.

Example Devices and Components

Figure 8:
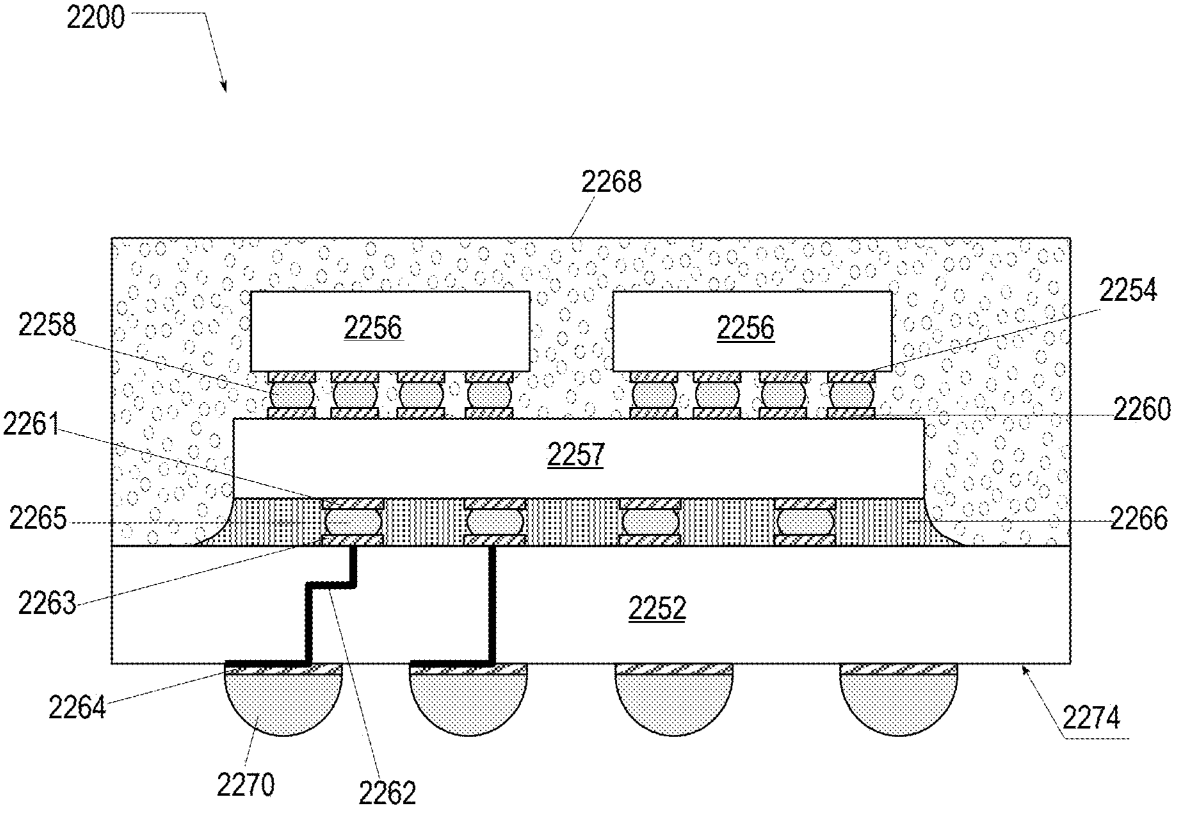
FIG. 8 is a cross-sectional view of a device package that includes one or more microelectronic assemblies in accordance with any of the embodiments disclosed herein.
Figure 9:
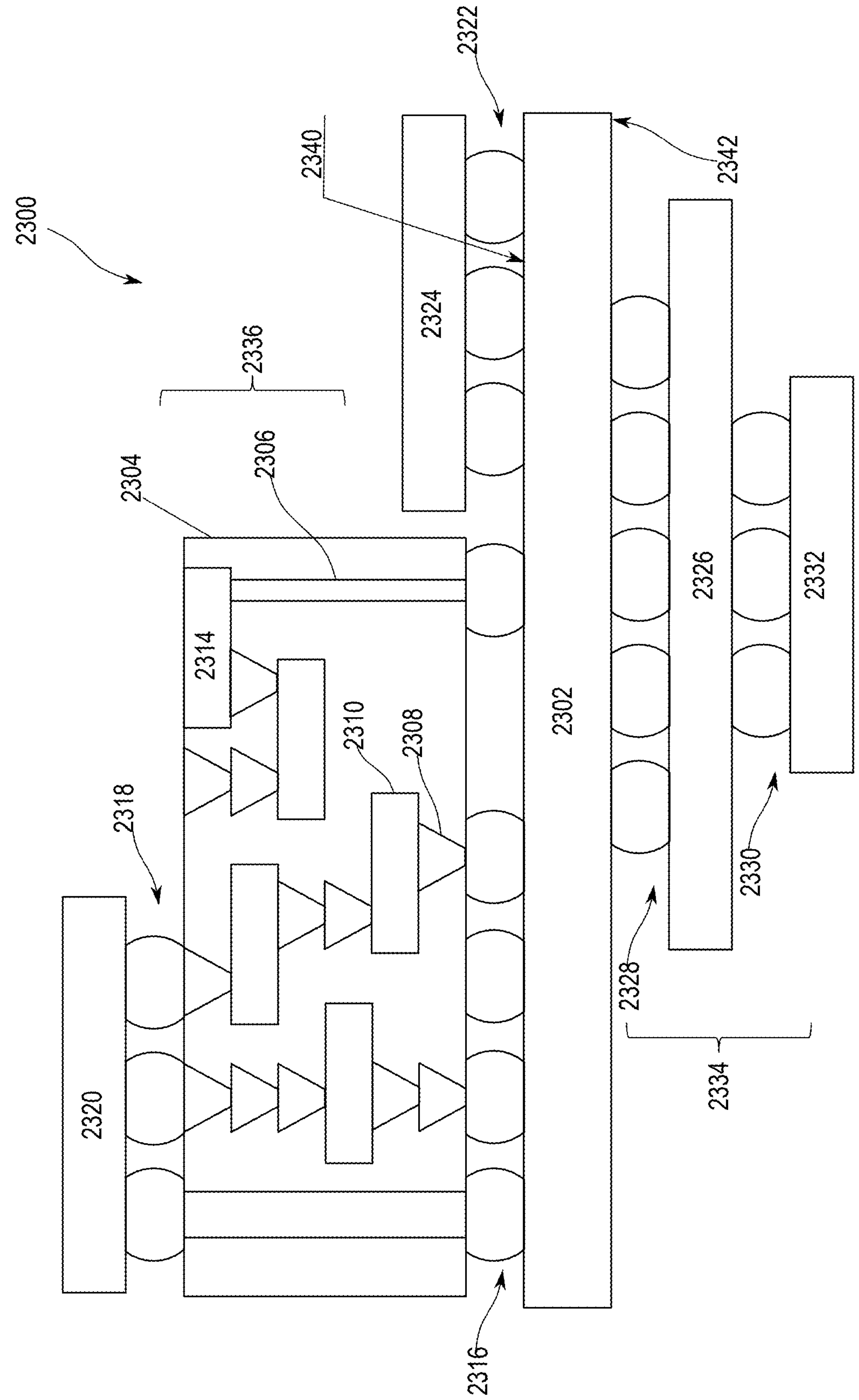
FIG. 9 is a cross-sectional side view of a device assembly that includes one or more microelectronic assemblies in accordance with any of the embodiments disclosed herein.

The packages disclosed herein, e.g., any of the embodiments shown in FIGS. 1-7 or any further embodiments described herein, may be included in any suitable electronic component. FIGS. 8-10 illustrate various examples of packages, assemblies, and devices that may be used with or include any of the IC packages as disclosed herein.

FIG. 8 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 9.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 9 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 8.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 8. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio-frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 10 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 8). In yet another example, any one or more of the components of computing device 2400 may include an IC device assembly 2300 (e.g., as shown in FIG. 9).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term “processing device” or “processor” may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio-frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100, FIGS. 1A-1D, 2A-2D), comprising: an interposer (e.g., 102) having a first face (e.g., 104(1)) and a second face (e.g., 104(2)) opposite to the first face; a package substrate (e.g., 106) coupled to the first face; an IC die (e.g., 108) coupled to the second face; and an edge ring (e.g., 110) in the interposer, wherein: the interposer includes: a core (e.g., 112) comprising a first dielectric material; and a redistribution layer (RDL) (e.g., 114(1), 114(2)), the RDL being on the first face or the second face, the RDL comprising a second dielectric material (e.g., 116) different from the first dielectric material, and the edge ring comprises: a metal trace (e.g., 118A, FIGS. 1B, 1C) in contact with the second dielectric material, the metal trace being along a periphery of the interposer; and a plurality of metal vias (e.g., 120) through the RDL, the plurality of metal vias in contact with the metal trace.

Example 2 provides the microelectronic assembly of example 1, wherein the metal trace is parallel and proximate to the periphery of the interposer.

Example 3 provides the microelectronic assembly of any one of examples 1-2, wherein the metal trace and the plurality of metal vias comprise copper.

Example 4 provides the microelectronic assembly of any one of examples 1-3, wherein: the first dielectric material is mold compound, and the second dielectric material is one of (i) polyimide and (ii) a compound of silicon and at least one of carbon, nitrogen, and oxygen.

Example 5 provides the microelectronic assembly of any one of examples 1-4, wherein the RDL further comprises a third dielectric material different from the first dielectric material and the second dielectric material.

Example 6 provides the microelectronic assembly of example 5, wherein: the first dielectric material is mold compound, the second dielectric material is polyimide and the third dielectric material is a compound of silicon and at least one of carbon, nitrogen and oxygen.

Example 7 provides the microelectronic assembly of any one of examples 1-4, wherein the core comprises a third dielectric material different from the first dielectric material and the second dielectric material.

Example 8 provides the microelectronic assembly of example 7, wherein: the first dielectric material is mold compound, the second dielectric material is one of (i) polyimide and (ii) a compound of silicon and at least one of carbon, nitrogen, and oxygen, and the third dielectric material is an underfill material.

Example 9 provides the microelectronic assembly of any one of examples 1-8, wherein the metal trace is further in contact with the core.

Example 10 provides the microelectronic assembly of any one of examples 1-9, wherein the edge ring further comprises a plurality of metal traces stacked with the metal trace to form a set of stacked metal traces in the RDL, the plurality of metal vias and the set of stacked metal traces forming a mesh structure through a cross-section of the RDL.

Example 11 provides the microelectronic assembly of example 10, wherein some metal traces in the set of stacked metal traces are in a shape of a continuous ring along the periphery of the interposer a plurality of metal traces stacked with the metal trace to form a set of stacked metal traces, the plurality of metal vias and the set of stacked metal traces forming a mesh structure through a cross-section of the RDL and other metal traces in the set of stacked metal traces are in a shape of a discontinuous ring along the periphery of the interposer.

Example 12 provides the microelectronic assembly of any one of examples 10-11, wherein some metal traces in the set of stacked metal traces are wider than other metal traces in the set of stacked metal traces.

Example 13 provides the microelectronic assembly of any one of examples 10-12, wherein some metal traces in the set of stacked metal traces are thicker than other metal traces in the set of stacked metal traces.

Example 14 provides the microelectronic assembly of any one of examples 10-13, wherein: the RDL further comprises a plurality of layers, metal traces of the set of stacked metal traces are between layers of the plurality of layers, and metal vias in the plurality of metal vias couple the metal traces in the set of stacked metal traces through the plurality of layers.

Example 15 provides the microelectronic assembly of example 14, wherein: at least one layer of the plurality of layers comprises the second dielectric material, and another layer of the plurality of layers comprises a third dielectric material different from the first dielectric material and the second dielectric material.

Example 16 provides the microelectronic assembly of example 15, wherein: the second dielectric material is an organic material, and the third dielectric material is an inorganic material.

Example 17 provides the microelectronic assembly of any one of examples 1-16, further comprising a plurality of metal pillars (e.g., 122) through the core, wherein the plurality of metal pillars is in contact with at least one of the metal trace and the plurality of metal vias.

Example 18 provides the microelectronic assembly of example 17, wherein any one of the metal pillars has a diameter same as any other of the plurality of metal pillars.

Example 19 provides the microelectronic assembly of example 18, wherein the diameter of the metal pillars is greater than a width of the metal trace (e.g., FIG. 1D).

Example 20 provides the microelectronic assembly of example 18, wherein the diameter of the metal pillars is smaller than a width of the metal trace.

Example 21 provides the microelectronic assembly of any one of examples 17-20, wherein any metal pillar has a diameter larger than any one of the plurality of metal vias.

Example 22 provides the microelectronic assembly of any one of examples 17-21, wherein a first pitch between adjacent ones of the metal vias is smaller than a second pitch between adjacent ones of the metal pillars.

Example 23 provides the microelectronic assembly of any one of examples 1-22, wherein: the RDL is a first RDL (e.g., 114(1)) on the first face of the interposer, the interposer further comprises a second RDL (e.g., 114(2)) on the second face, the second RDL comprising the second dielectric material, and the core of the interposer is between the first RDL and the second RDL.

Example 24 provides the microelectronic assembly of example 23, wherein: the metal trace is a first metal trace, the plurality of metal vias is a first plurality of metal vias, and the edge ring further comprises (e.g., FIG. 1B): a second metal trace in the second RDL parallel to the first metal trace, the second metal trace in contact with the second dielectric of the second RDL; and a second plurality of metal vias through the second RDL in contact with the second metal trace, the second plurality of metal vias and the second metal trace forming a mesh structure through a cross-section of the second RDL.

Example 25 provides the microelectronic assembly of example 24, wherein: the second metal trace is separated from the core by the second dielectric material of the second RDL.

Example 26 provides the microelectronic assembly of example 24, wherein: the second metal trace is further in contact with the core.

Example 27 provides the microelectronic assembly of any one of examples 24-26, wherein the edge ring further comprises a plurality of metal traces stacked with the second metal trace to form a set of stacked metal traces in the second RDL, the second plurality of metal vias and the set of stacked metal traces forming a mesh structure through a cross-section of the second RDL.

Example 28 provides the microelectronic assembly of any one of examples 24-27, wherein the second RDL comprises more than one layer of the second dielectric material.

Example 29 provides the microelectronic assembly of any one of examples 24-28, further comprising a plurality of metal pillars (e.g., 122) through the core, wherein the plurality of metal pillars is in contact with at least one of the second metal trace and the second plurality of metal vias.

Example 30 provides the microelectronic assembly of any one of examples 1-29, wherein an interface between the core and the RDL is rough to enhance adhesion of the metal trace.

Example 31 provides the microelectronic assembly of any one of examples 1-30, wherein an interface between the core and the RDL comprises a compound that includes silicon and nitrogen.

Example 32 provides the microelectronic assembly of any one of examples 1-31, wherein the metal trace is in a shape of a continuous ring along the periphery of the interposer (e.g., FIGS. 1D, 2D).

Example 33 provides the microelectronic assembly of any one of examples 1-31, wherein the metal trace is in a shape of a discontinuous ring along the periphery of the interposer (e.g., FIG. 3).

Example 34 provides the microelectronic assembly of any one of examples 1-33, wherein the metal trace forms a chamfer (e.g., 402, FIG. 4) at each corner of the interposer, with metal pillars through the core coupled to two opposing edges of the chamfer (e.g., FIG. 4).

Example 35 provides the microelectronic assembly of any one of examples 1-34, further comprising a fiducial mark (e.g., 142), wherein the fiducial mark is to align the microelectronic assembly for processing operations.

Example 36 provides the microelectronic assembly of any one of examples 1-35, wherein the edge ring further comprises bonding pads (e.g., 138A) on the first face of the interposer, wherein: a portion of the plurality of metal vias couple the bonding pads to the metal trace in the RDL, and interconnects (e.g., 140) at the bonding pads are coupled to the package substrate.

Example 37 provides the microelectronic assembly of example 36, wherein the interconnects do not provide any electrical connection during operation of the microelectronic assembly.

Example 38 provides the microelectronic assembly of any one of examples 1-37, wherein the metal trace and the plurality of metal vias are electrically isolated from other components in the microelectronic assembly.

Example 39 provides the microelectronic assembly of any one of examples 1-38, wherein the IC die is coupled to the second face of the interposer by interconnects (e.g., 126).

Example 40 provides the microelectronic assembly of any one of examples 1-39, wherein the IC die is a first IC die, and the interposer further includes a second IC die (e.g., 128, 132) in the core.

Example 41 provides the microelectronic assembly of example 40, wherein the second IC die (e.g., 128) comprises TSVs (e.g., 130).

Example 42 provides the microelectronic assembly of any one of examples 40-41, wherein the interposer further comprises bonding pads (e.g., 134) and the second IC die is coupled to the bonding pads by interconnects (e.g., 136).

Example 43 provides the microelectronic assembly of example 42, wherein the interposer further comprises underfill material (e.g., 137) around the interconnects.

Example 44 provides the microelectronic assembly of any one of examples 40-43, wherein the interposer further comprises TMVs (e.g., 124) in the first dielectric material surrounding the second IC die in the core.

Example 45 provides an interposer (e.g., 102) in a microelectronic assembly (e.g., 100), the interposer comprising: a core (e.g., 112) of a first dielectric material, the core having a first side and an opposing second side; an RDL (e.g., 114(1)) in contact with the first side of the core, the RDL comprising a second dielectric material (e.g., 116) different from the first dielectric material; and an edge ring (e.g., 110) comprising: a metal trace (e.g., 118A) proximate to the first side of the core along an entirety of a periphery of the interposer, the metal trace in contact with the second dielectric material, and a plurality of metal vias (e.g., 120) through the RDL, the plurality of metal vias in contact with the metal trace.

Example 46 provides the interposer of example 45, further comprising a plurality of metal pillars (e.g., 122) in the core, the plurality of metal pillars in contact with at least one of the metal trace and the plurality of metal vias.

Example 47 provides the interposer of any one of examples 45-46, wherein the edge ring further comprises a plurality of metal traces stacked with the metal trace to form a set of stacked metal traces in the RDL, the plurality of metal vias and the set of stacked metal traces forming a mesh structure through a cross-section of the RDL.

Example 48 provides the interposer of example 47, wherein some metal traces in the set are wider than other metal traces in the set.

Example 49 provides the interposer of any one of examples 45-48, wherein: the RDL is a first RDL (e.g., 114(1)), the metal trace is a first metal trace, the plurality of metal vias is a first plurality, the interposer further comprises a second RDL (e.g., 114(2)) in contact with the second side of the core, and the edge ring further comprises: a second metal trace in the second RDL along the entirety of the periphery of the interposer, the second metal trace in contact with the second dielectric material of the second RDL; and a second plurality of metal vias through the second RDL, the second plurality of metal vias in contact with the second metal trace.

Example 50 provides the interposer of example 49, further comprising a plurality of metal pillars (e.g., 122) in the core, the plurality of metal pillars in contact with: (i) at least one of the first metal trace and the first plurality of metal vias and (ii) at least one of the second metal trace and the second plurality of metal vias.

Example 51 provides the interposer of any one of examples 45-50, wherein the edge ring further comprises a plurality of metal traces stacked with the second metal trace to form a set of stacked metal traces in the second RDL, the second plurality of metal vias and the set of stacked metal traces forming a mesh structure through a cross-section of the second RDL.

Example 52 provides the interposer of example 51, wherein some metal traces in the set are wider than other metal traces in the set.

Example 53 provides the interposer of any one of examples 45-52, wherein: the interposer is coupled to a package substrate on the first side, and the interposer is coupled to an IC die on the second side.

Example 54 provides the interposer of any one of examples 45-53, wherein the interposer further comprises an IC die in the core, and TMVs in the first dielectric material surrounding the IC die.

Example 55 provides the interposer of any one of examples 45-54, wherein the second dielectric material comprises at least one of polyimide, silicon, carbon, nitrogen, and oxygen.

Example 56 provides an interposer (e.g., 102) in a microelectronic assembly (e.g., 100), the interposer comprising: a core (e.g., 112) comprising a first dielectric material; a RDL (e.g., 114) on a first face of the interposer, the RDL comprising a second dielectric material (e.g., 116) different from the first dielectric material; and an edge ring (e.g., 110), wherein the edge ring comprises: a set of stacked metal traces (e.g., 118) in the RDL, each metal trace in the set being along a periphery of the interposer and parallel to the first face, and a plurality of metal vias (e.g., 120) through the RDL, the plurality of metal vias in contact with the stacked metal traces in the RDL, the plurality of metal vias and the stacked metal traces forming a mesh structure through a cross-section of the RDL.

Example 57 provides the interposer of example 56, wherein: the RDL is a first RDL (e.g., 114(1)), the set of stacked metal traces is a first set, the plurality of metal vias is a first plurality, the interposer further comprises a second RDL (e.g., 114(2)), the core is between the first RDL and the second RDL, and the edge ring further comprises: a second set of stacked metal traces on either side of the second RDL, each metal trace in the second set being along a periphery of the interposer, and a second plurality of metal vias through the second RDL, the second plurality of metal vias in contact with the metal traces in the second set, the second plurality of metal vias and the second set of stacked metal traces forming another mesh structure through a cross-section of the second RDL.

Example 58 provides the interposer of any one of examples 56-57, further comprising a plurality of metal pillars (e.g., 122) in the core in contact with at least one of the stacked metal traces and the plurality of metal vias.

Example 59 provides the interposer of any one of examples 56-58, wherein an interface between the core and the RDL is rough.

Example 60 provides the interposer of any one of examples 56-59, wherein an interface between the core and the RDL comprises a compound that includes silicon and nitrogen.

Example 61 provides the interposer of any one of examples 56-60, wherein: the first dielectric material comprises mold compound, and the second dielectric material comprises one of (i) polyimide, and (ii) a compound of silicon and at least one of carbon, nitrogen and oxygen.

Example 62 provides the interposer of any one of examples 56-61, further comprising an IC die (e.g., 128, 132) in the core.

Example 63 provides the interposer of example 62, wherein the IC die (e.g., 128) comprises TSVs (e.g., 130).

Example 64 provides the interposer of any one of examples 62-63, wherein the IC die is electrically coupled by solder interconnects (e.g., 136) to a bonding pad (e.g., 134) in the interposer.

Example 65 provides the interposer of any one of examples 56-64, further comprising TMVs (e.g., 124) in the first dielectric material of the core.

Example 66 provides a method (e.g., FIGS. 5A-5E) of forming a microelectronic assembly, the method comprising: forming a portion of an interposer over a carrier (e.g., 502), the portion comprising a first dielectric material (e.g., 112) and having a first surface (e.g., 514(1)) removable attached (e.g., by adhesive 504) to the carrier and a second surface (e.g., 514(2)) opposite to the carrier; depositing a first metal trace (e.g., 118) on the second surface; depositing a second dielectric material (e.g., 116) over the first metal trace; forming a plurality of metal vias (e.g., 120) through the second dielectric material to contact the first metal trace; and depositing a second metal trace over the second dielectric material parallel to the first metal trace to complete an RDL (e.g., 114(2)).

Example 67 provides the method of example 66, further comprising depositing the second dielectric material over the second metal trace.

Example 68 provides the method of any one of examples 66-67, further comprising curing the first dielectric material and the second dielectric material.

Example 69 provides the method of any one of examples 66-68, further comprising: attaching an IC die (e.g., 108) to a third surface (e.g., 522) of the RDL, the third surface being opposite to the carrier; and encapsulating the IC die with the first dielectric material.

Example 70 provides the method of example 69, wherein the RDL is a first RDL, and the method further comprises: detaching the carrier to expose the first surface (e.g., 514 (1)); attaching an exposed fourth surface (e.g., 532) to the carrier, the exposed fourth surface being opposite to the first surface; depositing a third metal trace (e.g., 118) on the first surface; depositing the second dielectric material (e.g., 116) over the third metal trace; forming another plurality of metal vias (e.g., 120) through the second dielectric material to contact the third metal trace; and depositing a fourth metal trace over the second dielectric material parallel to the third metal trace to complete a second RDL (e.g., 114(1)).

Example 71 provides the method of any one of examples 66-70, wherein the first metal trace corresponds to a periphery of the microelectronic assembly.

Example 72 provides the method of example 71, wherein the first metal trace further comprises a fiduciary mark.

Example 73 provides the method of any one of examples 71-72, further comprising dicing the microelectronic assembly around the first metal trace.

Example 74 provides the method of any one of examples 66-73, wherein forming the interposer layer comprises: depositing metal pillars and pads corresponding to TMVs (e.g., 124) and bonding pads (e.g., 134) respectively on the carrier; attaching one or more IC dies (e.g., 128, 132) to the bonding pads; depositing the first dielectric material (e.g., 112) around the metal pillars and the one or more IC dies; forming conductive vias (e.g., 516) in the first dielectric material to contact the one or more IC dies.

Example 75 provides the method of example 74, wherein at least some of the metal pillars (e.g., 122) are coupled to the first metal trace.

Example 76 provides a method (e.g., FIGS. 7A-7D) of forming a microelectronic assembly, the method comprising: removably attaching an IC die (e.g., 108) embedded in a first dielectric material (e.g., 112) to a carrier (e.g., 502); depositing a first metal trace (e.g., 118) on an exposed surface (e.g., 702) opposite to the carrier; depositing a second dielectric material (e.g., 116) over the first metal trace; forming a plurality of metal vias (e.g., 120) through the second dielectric material to contact the first metal trace; and depositing a second metal trace over the second dielectric material parallel to the first metal trace to complete an RDL (e.g., 114(2)).

Example 77 provides the method of example 76, further comprising forming an interposer layer over the RDL, wherein the interposer layer comprises the first dielectric material with TMVs (e.g., 124) in the first dielectric material.

Example 78 provides the method of example 77, wherein forming the portion of the interposer comprises: depositing metal pillars and pads corresponding to TMVs (e.g., 124) and bonding pads (e.g., 134) respectively on the RDL; attaching one or more IC dies (e.g., 128, 132) to the bonding pads (e.g., by interconnects 136); depositing the first dielectric material around the metal pillars and the one or more IC dies; forming conductive vias (e.g., 516) in the first dielectric material to contact the one or more IC dies.

Example 79 provides the method of example 78, wherein at least some of the metal pillars (e.g., 120) are coupled to the second metal trace.

Example 80 provides the method of any one of examples 76-79, wherein the RDL is a first RDL (e.g., 114(2)), and the method further comprises: depositing a third metal trace on the interposer layer; depositing the second dielectric material over the third metal trace; forming a plurality of metal vias through the second dielectric material to contact the third metal trace; and depositing a fourth metal trace over the second dielectric material parallel to the third metal trace to complete a second RDL (e.g., 114(1)).

Example 81 provides the method of example 80, further comprising mechanically coupling a package substrate to the second RDL by interconnects, wherein: a portion of the interconnects are coupled to the fourth metal trace, and the portion of the interconnects are not electrically connected to the package substrate.

Example 82 provides the method of any one of examples 76-81, further comprising curing the first dielectric material and the second dielectric material.

Example 83 provides the method of any one of examples 76-82, wherein: the first metal trace corresponds to a periphery of the microelectronic assembly, and the first metal trace is electrically isolated in the microelectronic assembly.

Example 84 provides the method of any one of examples 76-83, wherein the first metal trace further comprises a fiduciary mark.

Example 85 provides the method of any one of examples 76-84, further comprising dicing the microelectronic assembly around the first metal trace.

Example 86 provides a method (e.g., FIGS. 6A-6E) of forming a microelectronic assembly, the method comprising: forming a first RDL on a carrier, the first RDL comprises a first metal trace along a periphery of an interposer of the microelectronic assembly and a first plurality of metal vias in contact with the first metal trace; forming a core of the interposer over the first RDL; forming a second RDL over the core, the second RDL comprising a second metal trace parallel to the first metal trace and a second plurality of metal vias in contact with the second metal trace; attaching an IC die to the second RDL; and encapsulating the IC die, wherein: the core comprises a first dielectric material, and the first RDL and the second RDL comprise a second dielectric material.

Example 87 provides the method of example 86, wherein forming the first RDL comprises: depositing the second dielectric material over the carrier; forming metal vias through the dielectric material, a portion of the metal vias comprising the plurality of metal vias; depositing conductive traces over the second dielectric material, a portion of the conductive traces comprising the first metal trace.

Example 88 provides the method of any one of examples 86-87, wherein forming the core comprises: depositing metal pillars over the first RDL, a portion of the metal pillars in contact with at least one of the first metal trace and the first plurality of metal vias; coupling IC dies to bonding pads on the first RDL; and filling a space around the metal pillars and the IC dies with the first dielectric material.

Example 89 provides the method of any one of examples 86-88, wherein forming the second RDL comprises: depositing the second dielectric material over the core; forming metal vias through the dielectric material, a portion of the metal vias comprising the second plurality of metal vias; and depositing conductive traces over the second dielectric material, a portion of the conductive traces comprising the second metal trace.

Example 90 provides the method of example 86, wherein forming the first RDL and forming the second RDL comprise forming a plurality of layers of the second dielectric material with a plurality of stacked metal traces therein, the stacked metal traces being stacked with respect to the first metal trace in the first RDL and to the second metal trace in the second RDL, the first plurality of metal vias in contact with the stacked metal traces in the first RDL, and the second plurality of metal vias in contact with the stacked metal traces in the second RDL.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
- an interposer having a first face and a second face opposite to the first face, wherein the interposer comprises:
  - a first layer comprising a die and a first dielectric material around the die, and
  - a second layer comprising a second dielectric material different from the first dielectric material, wherein the second layer is a redistribution layer (RDL);
- a conductive pillar through the first layer between the first face and the second face;
- a package substrate coupled to the first face;
- an edge ring in the interposer, wherein the edge ring comprises:
  - a conductive trace in the RDL and in contact with the second dielectric material, wherein the conductive trace along a periphery of the interposer, and
  - a plurality of conductive vias through the RDL, and in contact with the conductive trace, wherein the plurality of conductive vias comprises a first via and a second via coplanar with the first via;
- a bond pad at the first face of the interposer; and a conductive interconnect between and coupled with the bond pad and the package substrate, wherein:

the bond pad is coupled with the conductive trace of the edge ring through a via of the plurality of conductive vias, and the conductive interconnect is conductively isolated from conductive pathways in the package substrate.

2. The microelectronic assembly of claim 1, wherein the conductive trace is parallel and proximate to the periphery of the interposer.

3. The microelectronic assembly of claim 1, wherein:

the first dielectric material is mold compound, and the second dielectric material is one of (i) polyimide and (ii) a compound of silicon and at least one of carbon, nitrogen, and oxygen.

4. The microelectronic assembly of claim 1, wherein the edge ring further comprises a plurality of conductive traces stacked with the conductive trace to form a set of stacked conductive traces in the RDL, the plurality of conductive vias and the set of stacked conductive traces forming a mesh structure through a cross-section of the RDL.

5. The microelectronic assembly of claim 4, wherein:

the RDL further comprises a plurality of layers, conductive traces of the set of stacked conductive traces are between layers of the plurality of layers, and conductive vias of the plurality of conductive vias couple the conductive traces in the set of stacked conductive traces through the plurality of layers.

6. The microelectronic assembly of claim 5, wherein:

at least one layer of the plurality of layers comprises the second dielectric material, and another layer of the plurality of layers comprises a third dielectric material different from the first dielectric material and the second dielectric material.

7. The microelectronic assembly of claim 1, wherein: the conductive pillar is coupled with the conductive trace.

8. The microelectronic assembly of claim 1, wherein:

the RDL is a first RDL, the interposer further comprises a third layer, wherein the third layer is a second RDL, the second RDL comprising the second dielectric material, and the first layer of the interposer is between the first RDL and the second RDL.

9. The microelectronic assembly of claim 8, wherein:

the conductive trace is a first conductive trace, the plurality of conductive vias is a first plurality of conductive vias, and the edge ring further comprises:

a second conductive trace in the second RDL, wherein the second conductive trace is parallel to the first conductive trace, and wherein the second conductive trace is in contact with the second dielectric material of the second RDL, and a second plurality of conductive vias through the second RDL in contact with the second conductive trace, the second plurality of conductive vias and the second conductive trace forming a mesh structure through a cross-section of the second RDL.

10. The microelectronic assembly of claim 1, wherein the conductive trace is in a shape of a discontinuous ring along the periphery of the interposer.

11. The microelectronic assembly of claim 1, further comprising a fiducial mark proximate to a corner of the edge ring.

12. An interposer in a microelectronic assembly, the interposer comprising:

a core of a first dielectric material, the core having a first side and an opposing second side;

a die in the core, wherein the die is at least partially surrounded by the first dielectric material;

a conductive pillar through the core between the first side and the second side;

an RDL in contact with the first side of the core, the RDL comprising a second dielectric material different from the first dielectric material;

an edge ring comprising:

a conductive trace proximate to the first side of the core along an entirety of a periphery of the interposer, the conductive trace in contact with the second dielectric material, and a plurality of conductive vias through the RDL and in contact with the conductive trace, wherein the plurality of conductive vias comprises a first via in a plane substantially parallel with the RDL and a second via in the plane; and a bond pad coupled with the conductive trace of the edge ring through a conductive via of the plurality of conductive vias.

13. The interposer of claim 12, further comprising a plurality of conductive pillars in the core, the plurality of conductive pillars in contact with at least one of: the conductive trace and the plurality of conductive vias.

14. The interposer of claim 12, wherein:

the interposer is coupled to a package substrate on the first side, and the interposer is coupled to an IC die on the second side.

15. The microelectronic assembly of claim 1, wherein the conductive interconnect is a first conductive interconnect, and wherein the microelectronic assembly further comprises:

second conductive interconnects between and coupled with the die and the RDL, wherein a portion of the conductive pillar is in a plane with the second conductive interconnects, and wherein the plane is substantially parallel with the RDL.

16. The microelectronic assembly of claim 9, wherein:

the conductive pillar is between the second layer and the third layer, and the conductive pillar is coupled with the first conductive trace and the second conductive trace.

17. The microelectronic assembly of claim 16, wherein:

a first conductive via of the plurality of conductive vias has a first width, a second conductive via of the plurality of conductive vias has a second width, the conductive pillar has a third width, and the third width is greater than the first width and greater than the second width.

18. A microelectronic assembly, comprising:

an interposer comprising:

a first layer comprising a first dielectric material, a second layer comprising a second dielectric material that is different from the first dielectric material, wherein the second layer is a first redistribution layer (RDL), and a third layer comprising the second dielectric material, wherein the third layer is a second RDL;

an integrated circuit (IC) die over and coupled with the interposer;

a substrate below and coupled with a face of the interposer;

a first structure comprising a first conductive trace and a first conductive via in the first RDL along a periphery of the interposer;

a second structure comprising a second conductive trace and a second conductive via in the second RDL along the periphery;

a conductive pillar through the first layer and extending between the first RDL and the second RDL, wherein the conductive pillar is coupled with the first conductive trace and the second conductive trace, and wherein the conductive pillar has a greater width than the first conductive via;

a bond pad at the face of the interposer; and a conductive interconnect between and coupled with the bond pad and the substrate, wherein:

the bond pad is coupled with the first conductive trace, and the conductive interconnect is conductively isolated from conductive pathways in the substrate.

19. The microelectronic assembly of claim 18, further comprising:

a die in the first layer, wherein the die is coupled with the first RDL and the second RDL.

20. The interposer of claim 12, wherein the RDL is a first RDL, the conductive trace is a first conductive trace, the plurality of conductive vias is a first plurality of conductive vias, and the interposer further comprises:

a third layer, wherein the third layer is a second RDL, the second RDL comprising the second dielectric material, the core is between the first RDL and the second RDL, and the edge ring further comprises:

a second conductive trace in the second RDL parallel to the first conductive trace, the second conductive trace in contact with the second dielectric material of the second RDL, and a second plurality of conductive vias through the second RDL in contact with the second conductive trace.

* * * * *